(12) United States Patent
Naito

(10) Patent No.: US 10,256,229 B2
(45) Date of Patent: Apr. 9, 2019

(54) SEMICONDUCTOR DEVICE AND MANUFACTURING METHOD

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/823,414

(22) Filed: Nov. 27, 2017

(65) Prior Publication Data

US 2018/0082996 A1   Mar. 22, 2018

Related U.S. Application Data

(63) Continuation of application No. PCT/JP2016/086284, filed on Dec. 6, 2016.

(30) Foreign Application Priority Data

Dec. 11, 2015  (JP) .................................. 2015-241757
Sep. 14, 2016  (JP) .................................. 2016-180011

(51) Int. Cl.
*H01L 27/04* (2006.01)
*H01L 29/78* (2006.01)
(Continued)

(52) U.S. Cl.
CPC .......... *H01L 27/04* (2013.01); *H01L 29/0615* (2013.01); *H01L 29/0696* (2013.01);
(Continued)

(58) Field of Classification Search
CPC ............. H01L 29/0804; H01L 29/7397; H01L 29/7412; H01L 29/78; H01L 27/04;
(Continued)

(56) References Cited

U.S. PATENT DOCUMENTS 5,894,149 A * 4/1999 Uenishi ............... H01L 29/0653
257/331
2004/0217418 A1  11/2004 Imam et al.
(Continued)

FOREIGN PATENT DOCUMENTS

JP    2000106434 A    4/2000
JP    2006-059940 A    3/2006
(Continued)

OTHER PUBLICATIONS

International Search Report for International Patent Application No. PCT/JP2016/086284, issued by the Japan Patent Office dated Mar. 7, 2017.

*Primary Examiner* — Thanh T Nguyen

(57) ABSTRACT

It is aimed to realize both of reserving a channel formation region and suppressing a latch-up. A semiconductor device is provided, including: a semiconductor substrate; a plurality of trench portions provided at a front surface side of the semiconductor substrate, each of which has a portion extending in an extending direction; and a first conductivity-type emitter region and a second conductivity-type contact region provided between adjacent two trench portions and exposed on a front surface of the semiconductor substrate alternately in the extending direction, wherein on the front surface of the semiconductor substrate, a length of the emitter region at a central position between the two trench portions is shorter than a length of the emitter region at portions contacting the trench portions, and on the front surface of the semiconductor substrate, at least a part of a boundary of the emitter region has a curved shape.

21 Claims, 23 Drawing Sheets

(51) Int. Cl.
*H01L 29/08* (2006.01)
*H01L 29/739* (2006.01)
*H01L 29/74* (2006.01)
*H01L 29/66* (2006.01)
*H01L 29/06* (2006.01)
*H01L 29/40* (2006.01)
*H01L 27/07* (2006.01)

(52) U.S. Cl.
CPC ...... *H01L 29/0804* (2013.01); *H01L 29/0834* (2013.01); *H01L 29/404* (2013.01); *H01L 29/407* (2013.01); *H01L 29/66348* (2013.01); *H01L 29/7397* (2013.01); *H01L 29/7412* (2013.01); *H01L 29/78* (2013.01); *H01L 27/0727* (2013.01)

(58) Field of Classification Search
CPC .............. H01L 29/407; H01L 29/0615; H01L 29/66348; H01L 29/0696; H01L 29/0834; H01L 29/404; H01L 27/0727; H01L 29/08; H01L 29/739; H01L 29/74; H01L 29/7395; H01L 27/0711; H01L 2924/13055; H01L 29/0817; H01L 29/1095; H01L 29/66242; H01L 29/66333
See application file for complete search history.

(56) References Cited

U.S. PATENT DOCUMENTS

| | | | |
|---|---|---|---|
| 2005/0032287 A1* | 2/2005 | Nakazawa | H01L 29/66727 438/197 |
| 2005/0151187 A1* | 7/2005 | Wakimoto | H01L 29/0696 257/330 |
| 2007/0252195 A1 | 11/2007 | Yoshikawa et al. | |
| 2007/0267663 A1* | 11/2007 | Harada | H01L 29/0834 257/288 |
| 2008/0315250 A1* | 12/2008 | Onozawa | H01L 29/0834 257/139 |
| 2009/0020852 A1 | 1/2009 | Harada | |
| 2009/0097177 A1* | 4/2009 | Mori | H01L 27/0251 361/56 |
| 2012/0056241 A1* | 3/2012 | Sumitomo | H01L 29/0619 257/139 |
| 2015/0270378 A1 | 9/2015 | Konishi et al. | |
| 2017/0213908 A1* | 7/2017 | Fursin | H01L 29/66325 |

FOREIGN PATENT DOCUMENTS

| | | |
|---|---|---|
| JP | 2008034794 A | 2/2008 |
| JP | 2009026797 A | 2/2009 |
| JP | 2013201361 A | 10/2013 |
| JP | 2015179707 A | 10/2015 |

* cited by examiner

SEMICONDUCTOR DEVICE AND MANUFACTURING METHOD

The contents of the following Japanese patent applications are incorporated herein by reference:
NO. 2015-241757 filed in JP on Dec. 11, 2015,
NO. 2016-180011 filed in JP on Sep. 14, 2016, and
NO. PCT/JP2016/086284 filed on Dec. 6, 2016.

BACKGROUND

1. Technical Field

The present invention relates to a semiconductor device and a manufacturing method.

2. Related Art

Conventionally, semiconductor devices having an (N+)-type emitter region and a (P+)-type contact region which are alternately formed between two gate trenches on the front surface of a semiconductor substrate are known (see Patent Document 1, for example). The following documents are given as relevant prior art documents.
Patent Document 1: Japanese Patent Application Publication No. 2009-26797
Patent Document 2: Japanese Patent Application Publication No. 2000-106434
Patent Document 3: Japanese Patent Application Publication No. 2008-34794

A region at which a gate trench and an emitter region contact functions as a channel. Therefore, in view of reserving a channel formation region, it is preferable to increase the width of the emitter region. However, if the width of the emitter region is increased, a distance in the horizontal direction for which holes move in a base region positioned directly below the emitter region when turning off is increased. This causes a large voltage drop in the base region and facilitates occurrence of a latch-up.

SUMMARY

In a first aspect of the present invention, provided is a semiconductor device including a semiconductor substrate, a plurality of trench portions, a first conductivity-type emitter region and a second conductivity-type contact region. The plurality of trench portions may be provided at a front surface side of the semiconductor substrate and each of them may have a portion extending in an extending direction. The emitter region and the contact region may be provided between adjacent two trench portions and exposed on a front surface of the semiconductor substrate alternately in the extending direction of the trench portions. On the front surface of the semiconductor substrate, a length of the emitter region at a central position between the two trench portions may be shorter than a length of the emitter region at portions contacting the trench portions. On the front surface of the semiconductor substrate, at least a part of a boundary of the emitter region may have a curved shape.

The length of the emitter region at the central position may be greater than a difference between a depth of the emitter region and a depth of the contact region at the central position. The length of the emitter region at the central position may be greater than 1/3 of a length of the emitter region at portions contacting the trench portions.

The length of the emitter region at the central position may be greater than half a distance between the two trench portions. A depth of at least a partial region of the contact region formed may gradually decrease as a distance from each of the trench portions decreases.

On the front surface of the semiconductor substrate, the contact region may be formed apart from a point at which a sidewall of each of the trench portions and the boundary of the emitter region contact each other. On the front surface of the semiconductor substrate, a central portion of the contact region in the extending direction may be formed contacting a sidewall of each of the trench portions.

Two parts of the contact region provided sandwiching one part of the emitter region on the front surface of the semiconductor substrate may also be separated inside the semiconductor substrate. Two parts of the contact region provided sandwiching one part of the emitter region on the front surface of the semiconductor substrate may be connected below the emitter region.

A width of each of the trench portions may be greater than a distance between the two trench portions. The semiconductor device may further include an interlayer insulating film which is formed on the front surface of the semiconductor substrate, and in which a contact hole is formed in a region facing the contact region and a region facing the emitter region. The contact hole may be formed in a region facing the central position and may not be formed in regions contacting the trench portions.

The contact hole may be formed facing a region of the emitter region having a substantially constant length. A width of at least a partial region of a part of the contact hole formed facing the emitter region may be greater than a width of a part of the contact hole formed facing the contact region. The semiconductor device may include a second conductivity-type base region which is sandwiched between the trench portions, is shallower than a depth of each of the trench portions at positions contacting the trench portions, is deeper than a depth of the contact region, and has a lower impurity concentration than the contact region. The base region may be exposed on the front surface of the semiconductor substrate. An end of each portion of the contact region contacting the trench portions may contact the base region exposed on the front surface of the semiconductor substrate. The semiconductor device may further include a drift region which is provided below the base region and has a lower impurity concentration than the emitter region and an accumulation region which is provided between the drift region and the base region and has a higher impurity concentration than the drift region. The semiconductor device may further include an emitter electrode formed above the semiconductor substrate, and an interlayer insulating film formed between the semiconductor substrate and the emitter electrode, wherein in the interlayer insulating film, a contact hole for connecting the emitter electrode to the contact region is formed, and in a region of the contact region contacting the emitter electrode, a plug implantation region having a higher concentration than other portions of the contact region is formed.

In a second aspect of the present invention, provided is a manufacturing method for manufacturing a semiconductor device including a semiconductor substrate, a plurality of trench portions which are provided at a front surface side of the semiconductor substrate and each of which has a portion extending in an extending direction, and a first conductivity-type emitter region and a second conductivity-type contact region which are provided between adjacent two trench portions and exposed on a front surface of the semiconductor substrate alternately in the extending direction. In the manufacturing method, the emitter region may be formed by implanting first conductivity-type impurities into the front surface of the semiconductor substrate using an emitter mask having an opening width that is greater than an interval between the two trench portions. Also, the contact region may be formed by implanting second conductivity-type impurities into the front surface of the semiconductor substrate using a contact mask having an opening width that is smaller than the interval between the two trench portions. A region into which the second conductivity-type impurities are implanted may partially overlap with a region into which the first conductivity-type impurities are implanted.

An implantation region into which the second conductivity-type impurities are implanted may be separated corresponding to each part of the contact region. An interval between parts of the implantation region may be greater than a difference between a depth of the emitter region and a depth of the contact region at a central position between the two trench portions.

A length of the emitter region at a central position between the two trench portions may be greater than a distance between each of the trench portions and the implantation region into which the second conductivity-type impurities are implanted.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
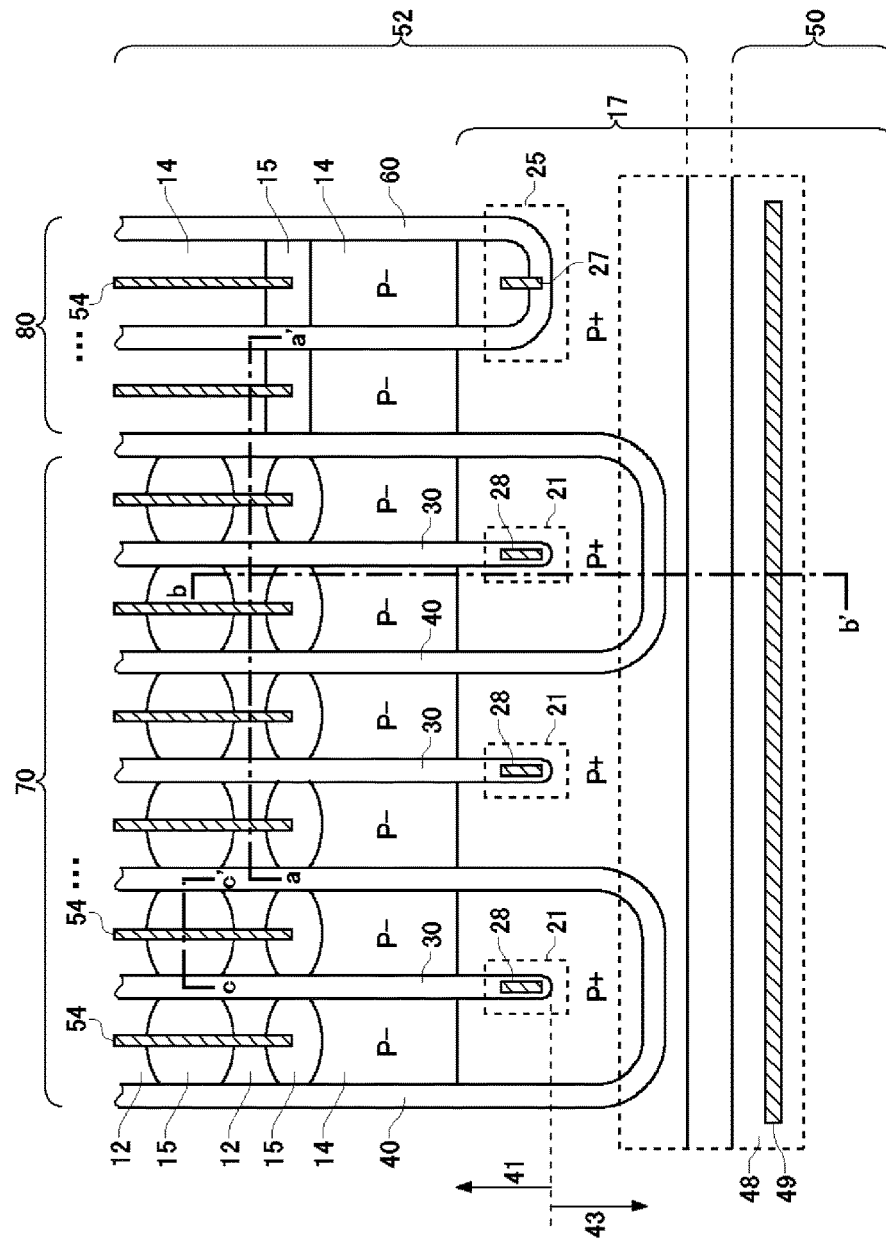
FIG. 1 is a plan view showing one example of a semiconductor device 100.

FIG. 1 is a plan view showing one example of a semiconductor device 100. The semiconductor device 100 of the present example is a semiconductor chip having a transistor section 70 including a transistor such as an IGBT (Insulated Gate Bipolar Transistor) and a diode section 80 including a diode such as an FWD (Free Wheel Diode). In FIG. 1, a part of the front surface of the chip around a chip end portion is shown, and other regions are omitted.

Also, although FIG. 1 shows an active region of the semiconductor substrate in the semiconductor device 100, the semiconductor device 100 may have an edge termination structure surrounding the active region. The active region refers to a region in which current flows when the semiconductor device 100 is controlled to be in an ON state. The edge termination structure mitigates electric field concentration at the front surface side of the semiconductor substrate. The edge termination structure has, for example, a guard ring, a field plate, a RESURF or any combination thereof.

The semiconductor device 100 of the present example includes, at the front surface side of the chip, a gate metal layer 50, an emitter electrode 52, a gate trench portion 40, a dummy trench portion 30, an emitter trench portion 60, a well region 17, an emitter region 12, a base region 14, a contact region 15, a polysilicon layer 21, a polysilicon layer 25, a polysilicon layer 48, a contact hole 27, a contact hole 28, a contact hole 49 and a contact hole 54.

The gate trench portion 40, the dummy trench portion 30, the emitter trench portion 60, the well region 17, the emitter region 12, the base region 14 and the contact region 15 are formed inside the semiconductor substrate at its front surface side, and the polysilicon layer 21, the polysilicon layer 25, the polysilicon layer 48, the emitter electrode 52 and the gate metal layer 50 are provided above the front surface of the semiconductor substrate.

Although an interlayer insulating film is formed between either of the emitter electrode 52 and the gate metal layer 50 and either of the front surface of the semiconductor substrate, the polysilicon layer 21, the polysilicon layer 25 and the polysilicon layer 48, it is omitted in FIG. 1. The contact hole 27, the contact hole 28, the contact hole 49 and the contact hole 54 are formed penetrating the interlayer insulating film.

The emitter electrode 52 and the gate metal layer 50 are formed of a metal-containing material. For example, at least a partial region of each electrode is formed of aluminum. Each electrode may have a region formed of a material containing tungsten.

One or more gate trench portions 40 and one or more dummy trench portions 30 are arrayed at a predetermined interval along a predetermined array direction in regions of the transistor section 70. The dummy trench portion 30 is formed extending in a predefined extending direction on the front surface of the semiconductor substrate. In the present example, the dummy trench portion 30 has a linear shape and is formed extending in a direction that is perpendicular to the array direction described above.

The gate trench portion 40 has a facing portion 41 and a protruding portion 43. The facing portion 41 is formed extending in the extending direction described above in an area facing the dummy trench portion 30. That is, the facing portion 41 is formed in parallel with the dummy trench portion 30. The protruding portion 43 extends further from the facing portion 41 and is formed in an area which does not face the dummy trench portion 30. In the present example, two facing portions 41 provided at both sides of the dummy trench portion 30 are connected by one protruding portion 43. At least a part of the protruding portion 43 may have a curved shape.

The emitter trench portion 60 is provided in a region of the diode section 80. The emitter trench portion 60 may have a similar shape to the gate trench portion 40. However, the length of the emitter trench portion 60 in the extending direction may be shorter than the gate trench portion 40. In the present example, the length of the emitter trench portion 60 is the same as that of the dummy trench portion 30.

The polysilicon layer 48 is formed to cover a part of the protruding portion 43. The polysilicon layer 48 is connected to a conductive portion formed inside the protruding portion 43. The polysilicon layer 48 is formed extending from the protruding portion 43 to the end portion side of the semiconductor substrate. The gate metal layer 50 is formed to cover the polysilicon layer 48 at the end portion side of the semiconductor substrate. The gate metal layer 50 and the polysilicon layer 48 are connected via the contact hole 49.

The emitter electrode 52 is formed above the gate trench portion 40, the dummy trench portion 30, the emitter trench portion 60, the well region 17, the emitter region 12, the base region 14 and the contact region 15. The emitter electrode 52 is formed being separated from the gate metal layer 50.

The well region 17 is formed to cover a predetermined area from an end portion of the semiconductor substrate at which the gate metal layer 50 is provided. Partial regions of the dummy trench portion 30, the emitter trench portion 60 and the facing portion 41 at the gate metal layer 50 side are formed in the well region 17. The protruding portion 43 may be entirely formed in the well region 17. The semiconductor substrate has a first conductivity type and the well region 17 has a second conductivity type different from the semiconductor substrate. In the present example, the semiconductor substrate is of (N−)-type and the well region 17 is of (P+)-type. The present example is described assuming that the first conductivity type is N-type and the second conductivity type is P-type. However, the first and the second conductivity types may be reversed from the above ones.

The base region 14 is formed in regions sandwiched between trench portions. The base region 14 is of the second conductivity type and has a lower impurity concentration than the well region 17. In the present example, the base region 14 is of (P−)-type.

The contact region 15, which is of the second conductivity type and has a higher impurity concentration than the base region 14, is formed in the front surface of the base region 14. In the present example, the contact region 15 is of (P+)-type. Also, in the transistor section 70, the emitter region 12, which is of the first conductivity type and has a higher impurity concentration than the semiconductor substrate, is selectively formed in parts of the front surface of the contact region 15. In the present example, the emitter region 12 is of (N+)-type.

Each of the contact region 15 and the emitter region 12 is formed extending from one of two adjacent trench portions to the other of the trench portions. One or more contact regions 15 and one or more emitter regions 12 in the transistor section 70 are formed to be exposed alternately along the extending direction of the trench portions in regions sandwiched between trench portions.

In the transistor section 70, the contact hole 54 is formed above each region of the contact region 15 and the emitter region 12. In the present example, the contact hole 54 is formed along the extending direction of the trench portions at the central position between adjacent two trench portions. The width of the contact hole 54 is smaller than the distance between adjacent two trench portions. Also, the contact hole 54 is formed apart from the gate trench portion 40. Also, the contact hole 54 is not formed in regions corresponding to the base region 14 and the well region 17. The emitter electrode 52 is connected to the emitter region 12 and the contact region 15 via the contact hole 54.

The polysilicon layer 21 is formed on a partial region of the dummy trench portion 30. In the present example, the polysilicon layer 21 is provided on an end portion of the dummy trench portion 30 formed in the well region 17. The polysilicon layer 21 is connected to a conductive portion formed inside the dummy trench portion 30. The polysilicon layer 21 is connected to the emitter electrode 52 via the contact hole 28.

The polysilicon layer 25 is formed on a partial region of the emitter trench portion 60. In the present example, the polysilicon layer 25 is provided on an end portion of the emitter trench portion 60 formed in the well region 17. The polysilicon layer 25 is connected to a conductive portion formed inside the emitter trench portion 60. The polysilicon layer 25 is connected to the emitter electrode 52 via the contact hole 27.

Figure 2:
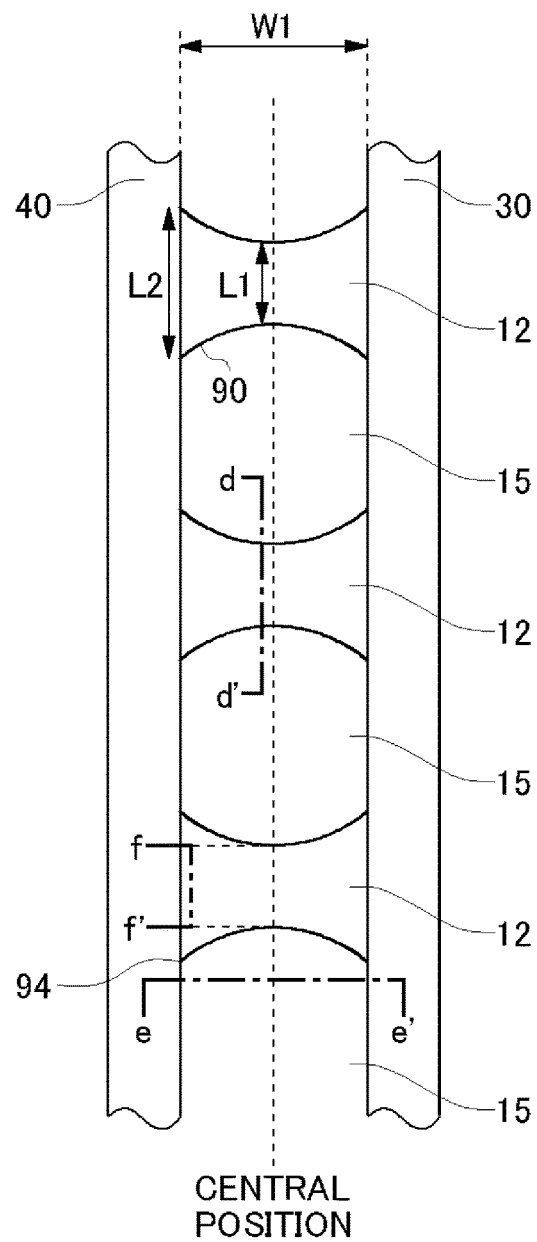
FIG. 2 shows an exemplary shape of the emitter region 12 and the contact region 15.

FIG. 2 shows an exemplary shape of the emitter region 12 and the contact region 15. The distance between two trench portions on the front surface of the semiconductor substrate (mesa width) is referred to as W1. On the front surface of the semiconductor substrate, the length L1 of the emitter region 12 at the central position between two trench portions is shorter than the length L2 of the emitter region 12 at portions contacting the trench portions. Note that the central position between two trench portions refers to a position at a distance of W1/2 from the end portion of each trench portion.

By making the length L2 of the emitter region 12 at portions contacting a trench portion longer, it is possible to increase the area of a region in which a channel is to be formed. Also, by making the length L1 of the emitter region 12 at the central position shorter, it is possible to decrease the distance for which holes flowing from the back surface side of the semiconductor substrate move in the base region 14 having a higher resistance than the contact region 15 at the front surface side of the semiconductor substrate. As a result, it is possible to suppress the latch-up.

At least a part of the boundary 90 of the emitter region 12 has a curved shape on the front surface of the semiconductor substrate. The boundary 90 indicates the boundary between the emitter region 12 and another region and, in the present example, is the boundary between the emitter region 12 and the contact region 15. Also, the entire boundary 90 of the emitter region 12 may have a curved shape. Also, a half or more of the total length of the boundary 90 of the emitter region 12 may have a curved shape. The boundary 90 of the emitter region 12 contacts the sidewall of a trench portion at a contact point 94 on the front surface of the semiconductor substrate.

In the present example, the boundary 90 of the emitter region 12 has a curved shape which is convex toward the inside of the emitter region 12. Also, in the present example, the boundary 90 of the emitter region 12 has a symmetric shape with respect to a line passing through the central position between adjacent two trench portions. However, if the front surface is observed using, for example, Scanning Capacitance Microscopy (SCM), it might be asymmetric to some extent due to setting angle of a sample or the like. If all emitter regions in the observation field are tilted by a uniform angle in the range of 60 degrees or more and 120 degrees or less with respect to a line passing through the central position between adjacent two trench portions, it may be regarded that the boundary 90 of the emitter region 12 has a symmetric shape with respect to the line passing through the central position between adjacent two trench portions.

By forming the boundary 90 of the emitter region 12 to have a curved shape as described above, it is possible to prevent holes flowing when turning off from concentrating at a particular location in the boundary 90 of the emitter region 12. Also, even if the position of the contact hole 54 is varied while providing a difference between lengths L1 and L2 of the emitter region 12, it is possible to reduce variation in the area of the emitter region 12 exposed by the contact hole 54.

Also, the emitter region 12 can be formed by implanting and diffusing P-type impurities at the central position between two trench portions, as described later. Therefore, a mask used for implanting P-type impurities is not required to have a complex shape, and the emitter region 12 can be easily formed.

Figure 3:
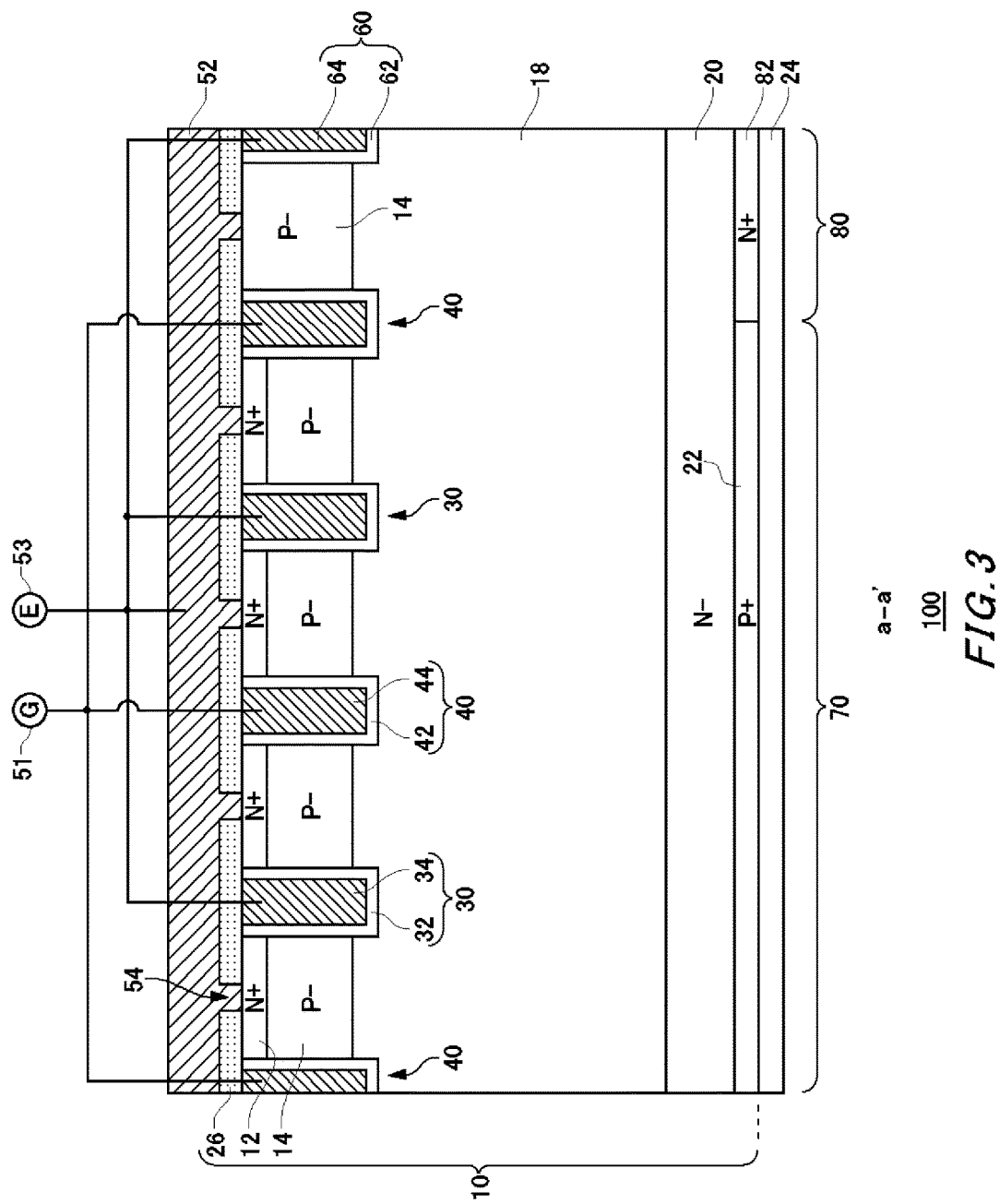
FIG. 3 shows a cross section taken along a-a' in FIG. 1.

FIG. 3 shows a cross section taken along a-a' in FIG. 1. The cross section taken along a-a' is a plane which is perpendicular to the extending direction of the trench portions and passes through the center of the emitter region 12 in the extending direction. The semiconductor device 100 of the present example includes, in the cross section, a semiconductor substrate 10, an emitter electrode 52 and a collector electrode 24. The emitter electrode 52 is formed above the front surface of the semiconductor substrate 10.

An interlayer insulating film 26 is formed between the emitter electrode 52 and the semiconductor substrate 10. The emitter electrode 52 is connected to the emitter region 12 through the contact hole 54 provided in the interlayer insulating film 26. The emitter electrode 52 is also electrically connected to an emitter terminal 53.

The collector electrode 24 is formed on the back surface of the semiconductor substrate 10. The collector electrode 24 is electrically connected to a collector terminal. The emitter electrode 52 and the collector electrode 24 are formed of a conductive material such as metal. As used herein, for each member such as a substrate, layer and region, a surface closer to the emitter electrode 52 is referred to as a front surface and a surface closer to the collector electrode 24 is referred to as a back surface or a bottom portion. Also, a direction connecting the emitter electrode 52 and the collector electrode 24 is referred to as a depth direction.

The semiconductor substrate 10 may be a silicon substrate, or may be a silicon carbide substrate, a nitride semiconductor substrate, or the like. A (P−)-type base region 14 is formed in the semiconductor substrate 10 at its front surface side. Also, an (N+)-type emitter region 12 is selectively formed in partial regions of the base region 14 at its front surface side.

Also, the semiconductor substrate 10 further includes an (N−)-type drift region 18, an (N−)-type buffer region 20, a (P+)-type collector region 22, and an (N+)-type cathode region 82. An (N+)-type accumulation region having a higher impurity concentration than the drift region 18 may also be formed at the back surface side of the base region 14. The accumulation region is formed between adjacent trenches. By providing the accumulation region, it is possible to increase the IE effect and reduce the ON voltage.

The drift region 18 is formed at the back surface side of the base region 14. The buffer region 20 is formed at the back surface side of the drift region 18. The impurity concentration of the buffer region 20 is higher than the impurity concentration of the drift region 18. The buffer region 20 may function as a field stop layer to prevent a depletion layer expanding from the back surface side of the base region 14 from reaching the collector region 22 and the cathode region 82.

The collector region 22 is formed at the back surface side of the buffer region 20 in a region of the transistor section 70. The cathode region 82 is formed at the back surface side of the buffer region 20 in a region of the diode section 80. Also, the collector electrode 24 is provided on the back surface of the collector region 22 and the cathode region 82.

One or more gate trench portions 40, one or more dummy trench portions 30 and one or more emitter trench portions 60 are formed at the front surface side of the semiconductor substrate 10. Each trench portion extends from the front surface of the semiconductor substrate 10 and penetrates the base region 14 to reach the drift region 18. In the present example, the gate trench portion 40 and the dummy trench portion 30 extend from the front surface of the semiconductor substrate 10 and penetrate the emitter region 12 and the base region 14 to reach the drift region 18. Also, the emitter trench portion 60 extends from the front surface of the semiconductor substrate 10 and penetrates the base region 14 to reach the drift region 18.

The gate trench portion 40 includes a gate trench, an insulating film 42 and a gate conductive portion 44 formed at the front surface side of the semiconductor substrate 10. The insulating film 42 is formed to cover the inner wall of the gate trench. The insulating film 42 may be formed by oxidizing or nitriding semiconductor materials of the inner wall of the gate trench. The gate conductive portion 44 is formed inside the gate trench and at a position closer to its innermost than the insulating film 42. That is, the insulating film 42 insulates the gate conductive portion 44 and the semiconductor substrate 10 from each other. The gate conductive portion 44 is formed of a conductive material such as polysilicon.

The gate conductive portion 44 includes at least a region facing its adjacent base region 14. Each gate conductive portion 44 is electrically connected to the gate terminal 51. In the present example, as shown in FIG. 1, the gate conductive portion 44 is electrically connected to the polysilicon layer 48 at the protruding portion 43. Also, the polysilicon layer 48 is connected to the gate metal layer 50, and the gate metal layer 50 is electrically connected to the gate terminal 51. When a predetermined voltage is applied to the gate conductive portion 44 via the gate terminal 51, a channel is formed in an interfacial surface layer of the base region 14 contacting the gate trench portion 40.

The dummy trench portion 30 includes a dummy trench, an insulating film 32 and a dummy conductive portion 34 formed at the front surface side of the semiconductor substrate 10. The insulating film 32 is formed to cover the inner wall of the dummy trench. The insulating film 32 may be formed by oxidizing or nitriding semiconductor materials of the inner wall of the dummy trench.

The dummy conductive portion 34 is formed inside the dummy trench and at a position closer to its innermost than the insulating film 32. That is, the insulating film 32 insulates the dummy conductive portion 34 and the semiconductor substrate 10 from each other. The dummy conductive portion 34 is formed of a conductive material such as polysilicon. According to the semiconductor device 100 of the present example, by providing the dummy trench portion 30, it is possible to increase the implantation enhancement effect (the IE effect) for implanting carriers into the drift region to reduce the ON voltage.

In the present example, the gate trench portion 40 and the dummy trench portion 30 are arranged alternately in a predetermined array direction as shown in FIG. 3. Also, the trench portions may be arranged at a constant interval. However, the arrangement of the trenches is not limited to the above-described example. A plurality of gate trench portions 40 may be arranged between two dummy trench portions 30. Also, the number of gate trench portions 40 provided between each two dummy trench portions 30 may not be constant. The dummy trench portion 30 and the gate trench portion 40 may have the same length in the depth direction.

The diode section 80 is provided in a region adjacent to the transistor section 70. The diode section 80 includes the base region 14, the drift region 18 and the buffer region 20 in the same layer as those in the transistor section 70. In the diode section 80, a cathode region 82 is provided at the back surface side of the buffer region 20. Also, the diode section 80 includes one or more emitter trench portions 60. Also, the emitter region 12 is not formed in the diode section 80.

The emitter trench portion 60 is formed extending from the front surface side of the base region 14 and penetrating the base region 14 to reach the drift region 18. Similar to the dummy trench portion 30, each emitter trench portion 60 includes an insulating film 62 and an emitter conductive portion 64. The emitter trench portion 60 may have the same structure as that of the dummy trench portion 30.

Also, in the present example, the interval between trench portions in the transistor section 70 is the same as the interval between emitter trench portions 60 in the diode section 80. As shown in FIG. 3, if the gate trench portion 40 and the dummy trench portion 30 are alternately arranged in the transistor section 70, the interval between a gate trench portion 40 and a dummy trench portion 30 may be the same as the interval between emitter trench portions 60.

Figure 4:
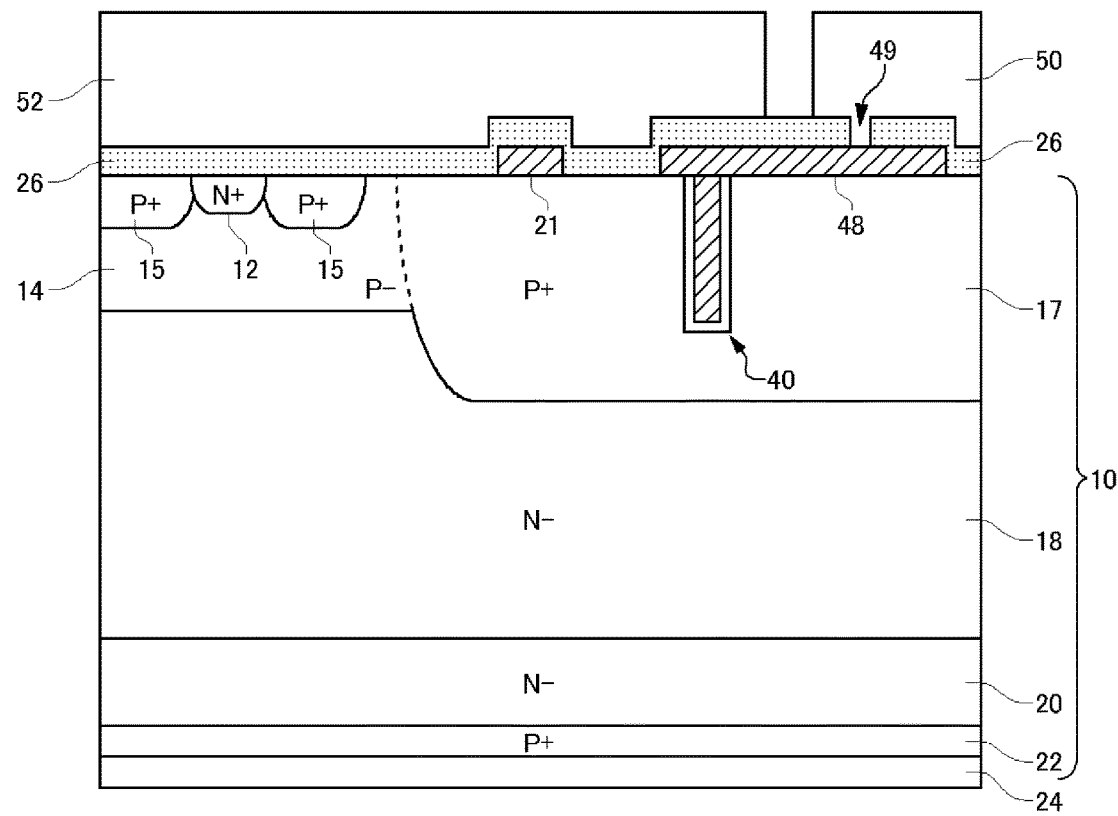
FIG. 4 shows one example of a cross section taken along b-b' in FIG. 1.

FIG. 4 shows one example of a cross section taken along b-b' in FIG. 1. The cross section taken along b-b' is a plane which is perpendicular to the front surface of the semiconductor substrate and parallel to the extending direction of the trench portions, and passes between the contact hole 54 and a trench portion. In the present example, the semiconductor device 100 includes, in the cross section, the semiconductor substrate 10, the interlayer insulating film 26, the polysilicon layer 21, the polysilicon layer 48, the emitter electrode 52 and the collector electrode 24. The interlayer insulating film 26 is formed between either of the gate metal layer 50 and the emitter electrode 52 and either of the polysilicon layer 21, the polysilicon layer 48 and the semiconductor substrate 10. The contact hole 49 is formed in the interlayer insulating film 26. Although an insulating film having approximately the same thickness as the insulating film 42 is formed between the polysilicon layer 21 and the semiconductor substrate 10, its illustration is omitted in FIG. 4. Similarly, an insulating film having approximately the same thickness as the insulating film 42 is formed between the polysilicon layer 48 and the semiconductor substrate 10.

The contact hole 49 exposes a part of the polysilicon layer 48 on the front surface of the semiconductor substrate 10. The gate metal layer 50 contacts the polysilicon layer 48 through the contact hole 49.

Also, the contact region 15 and the emitter region 12 are alternately formed in the base region 14. The contact region 15 may be formed to a deeper position than the emitter region 12, or may be formed to a shallower position than the emitter region 12.

Figure 5:
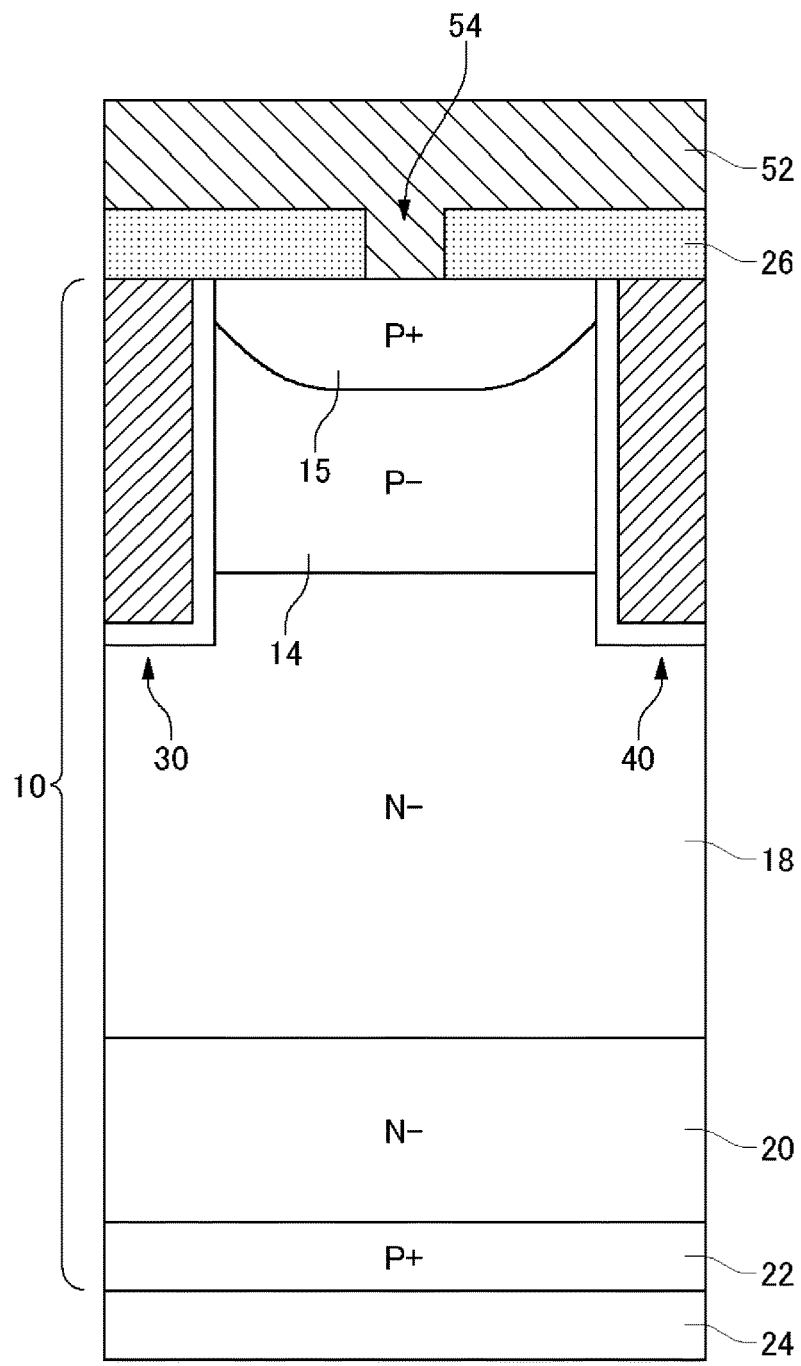
FIG. 5 shows one example of a cross section taken along c-c' in FIG. 1.

FIG. 5 shows one example of a cross section taken along c-c' in FIG. 1. The cross section taken along c-c' is a plane which is perpendicular to the extending direction of the trench portions and passes through the central portion of the contact region 15 in the extending direction. In the cross section, the contact region 15 is formed to positions contacting sidewalls of trench portions on the front surface of the semiconductor substrate 10.

Also, in the cross section, at least a partial region of the contact region 15 is formed at a depth which gradually decreases as the distance from the gate trench portion 40 or the dummy trench portion 30 decreases. The entire contact region 15 may be formed at a depth which gradually decreases as the distance from the gate trench portion 40 or the dummy trench portion 30 decreases. Also, the contact region 15 may be formed at an almost constant depth in the vicinity of the central position between trench portions.

The depth of the contact region 15 decreases as the distance from a trench portion decreases, and it is thereby possible to suppress formation of a P-type region in a region contacting the trench portion and in which the emitter region 12 is to be formed. This makes it possible to suppress narrowing of a region in which a channel is to be formed and increase in the threshold voltage.

Figure 6:
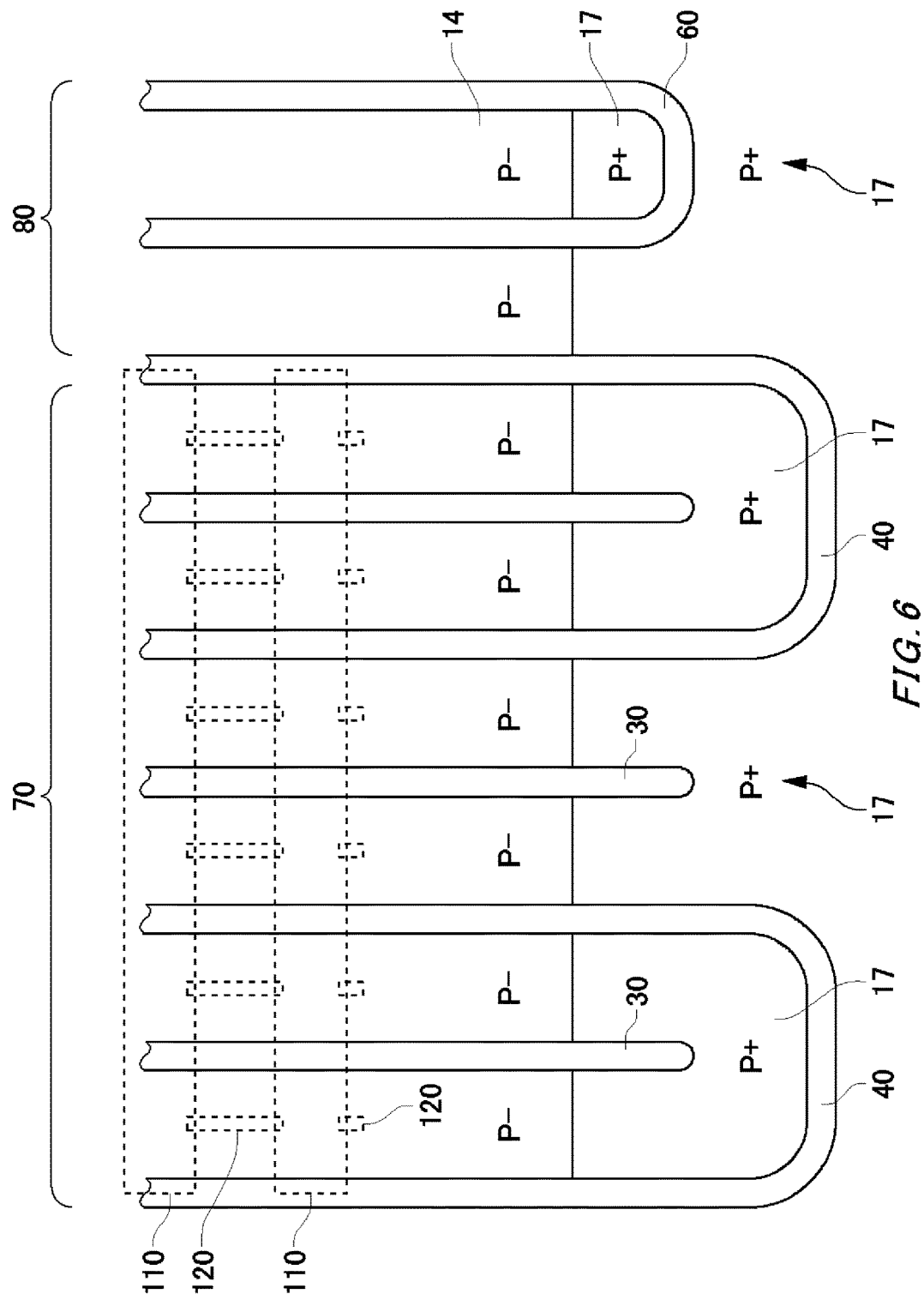
FIG. 6 shows one example of a manufacturing method of the semiconductor device 100.

FIG. 6 shows one example of a manufacturing method of the semiconductor device 100. First, a gate trench portion 40, a dummy trench portion 30, an emitter trench portion 60, a base region 14 and a well region 17 are formed at the front surface side of the semiconductor substrate 10.

Then, N-type impurities and P-type impurities are implanted into the front surface of the semiconductor substrate 10 using an emitter mask 110 and a contact mask 120. In FIG. 6, opening regions of the emitter mask 110 and the contact mask 120 are indicated by enclosed dotted lines. Note that a mask for the diode section 80 is omitted.

In the array direction of the trench portions, the width of the opening of the emitter mask 110 is greater than the interval between two trench portions. The opening of the emitter mask 110 is formed extending from each trench portion to reach its adjacent trench portion in the array direction of the trench portions. In the present example, the opening of the emitter mask 110 is formed in a shape of a band that crosses a plurality of trench portions in the array direction of the trench portions. Also, the opening of the emitter mask 110 is formed in a shape of a plurality of parallel bands corresponding to regions in which the emitter region 12 is to be formed. By implanting and diffusing N-type impurities using the emitter mask 110 of the present example, the emitter region 12 is formed at a depth that is generally uniform in the array direction of the trench portion.

The opening of the contact mask 120 is formed between adjacent two trench portions and in an area that does not contact each trench portion. In the present example, the opening of the contact mask 120 is thinner than the interval between two trench portions and is formed in a shape of a band extending in a direction parallel to the trench portions. The width of the contact mask 120 may be half or less or ¼ or less of the distance W1 between two trench portions shown in FIG. 2. The opening of the contact mask 120 is arranged at the center between two trench portions such that distances from the trench portions at both sides are equal.

In the present example, the opening of the contact mask 120 is provided being separated in the extending direction of the trench portions corresponding to regions in which the contact region 15 is to be formed. That is, it is provided between parts of the opening of the emitter mask 110. However, a portion of the opening of the contact mask 120 is positioned overlapping with the opening of the emitter mask 110. That is, a region into which P-type impurities are to be implanted and a region into which N-type impurities are to be implanted overlap with each other. In the present example, both ends of each part of the opening of the contact mask 120 overlap with the opening of the emitter mask 110.

Figure 7:
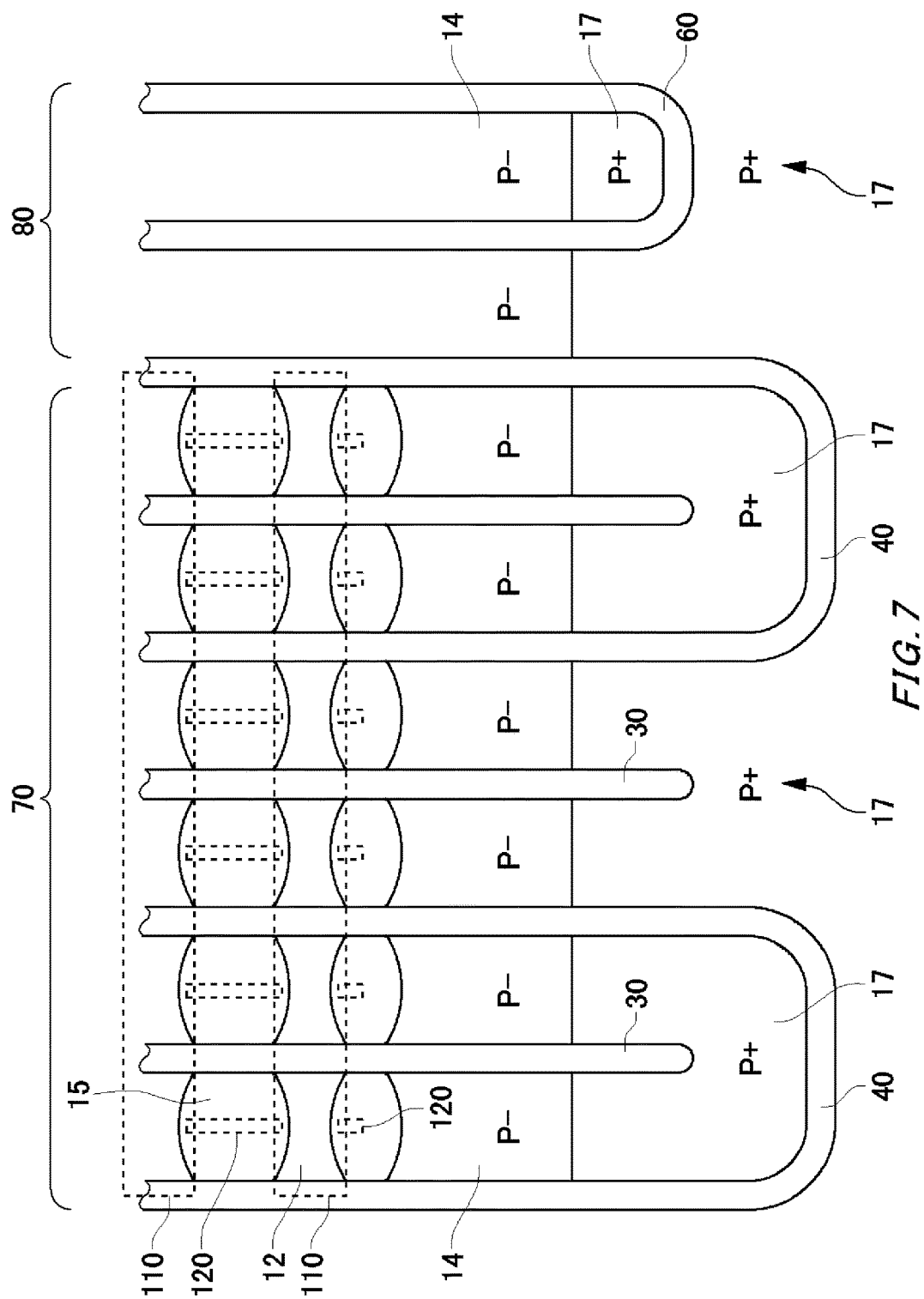
FIG. 7 shows a positional relationship between the emitter mask 110 and contact mask 120 and the emitter region 12 and contact region 15 shown in FIG. 6.

FIG. 7 shows a positional relationship between the emitter mask 110 and contact mask 120 and the emitter region 12 and contact region 15 shown in FIG. 6. After N-type impurities and P-type impurities are implanted using the emitter mask 110 and the contact mask 120 shown in FIG. 6, the impurities are activated and diffused by heat treatment or the like. N-type impurities and P-type impurities may be implanted in an arbitrary order.

Note that formation of the contact region 15 in the diode section 80 is omitted in FIG. 7. That is, implantation efficiency of minority carriers (holes) may be lowered by reducing the total impurity amount of P-type impurities in the diode section 80 relative to the transistor section 70. This makes it possible to prevent increase in the reverse recovery peak current during the reverse recovery operation of the diode section 80. Otherwise, the contact region 15 may also be formed in the diode section 80. In this case, the contact region 15 in the diode section 80 may be formed at the same time as the contact region 15 in the transistor section 70.

At regions directly below the opening of the emitter mask 110 and overlapping with the opening of the contact mask 120, a large amount of P-type impurities is implanted and diffused, so that the length of the emitter region 12 becomes relatively short. On the other hand, at regions adjacent to trench portions, the diffusion amount of P-type impurities is relatively small, and therefore the length of the emitter region 12 does not become as short as above. It is therefore possible to reserve a region in which a channel is to be formed.

Note that the length L1 of the emitter region 12 can be shortened by increasing the area of portions at which the openings of the emitter mask 110 and the contact mask 120 overlap. However, if the area of the portions at which the openings overlap is excessively increased, P-type impurities are also diffused in a portion that needs to be of N-type in regions adjacent to trench portions, making it difficult to reserve the length L2 of the emitter region 12.

It is therefore preferable that, in the extending direction of the trench portions, the length of the portions at which the openings of the emitter mask 110 and the contact mask 120 overlap is ⅓ or less of the length of the emitter mask 110. The length of the portions at which the openings overlap may be ¼ or less of the length of the emitter mask 110.

Similarly, it is preferable that the length of the emitter region 12 at the central position between two trench portions (L1 shown in FIG. 2) is greater than ⅓ of the length of the emitter region 12 at portions contacting trench portions (L2). L1 may be greater than ½ of L2.

The length L1 of the emitter region 12 may also be greater than half the distance W1 between two trench portions. The length L1 of the emitter region 12 may also be greater than the shortest distance between a trench portion and the opening of the contact mask 120. By forming the length L1 of the emitter region 12 to be a predetermined length or more, it is possible to prevent diffusion of P-type impurities in a portion that needs to be of N-type in a region adjacent to trench portions and to reserve the length L2 of the emitter region 12.

Figure 8:
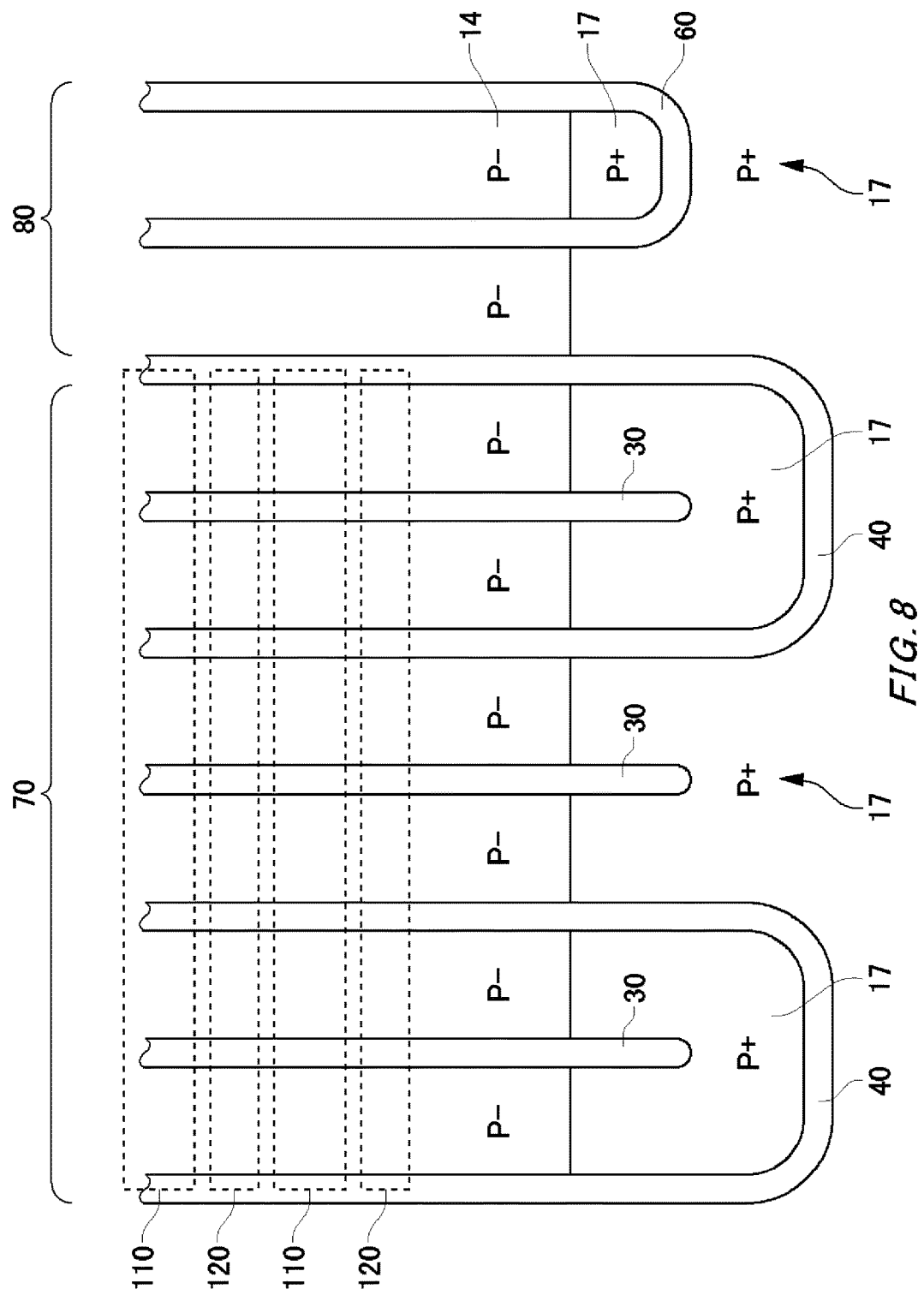
FIG. 8 shows one example of a manufacturing method according to a comparative example.

FIG. 8 shows one example of a manufacturing method according to a comparative example. The shape of the opening of the emitter mask 110 in the present example is the same as that in the example shown in FIG. 6. In the present example, the shape of the opening of the contact mask 120 is a shape of a band that extends in the array direction of the trench portions.

In the present example, the boundary between the emitter region and the contact region does not have a curved shape but a linear shape. It is therefore impossible to suppress the latch-up while reserving a region in which carriers are to be formed. Also, the opening position of the emitter mask 110 and the opening position of the contact mask 120 do not overlap with each other. Therefore, if the mask position is varied, the emitter region and the contact region might be apart from each other.

Figure 9:
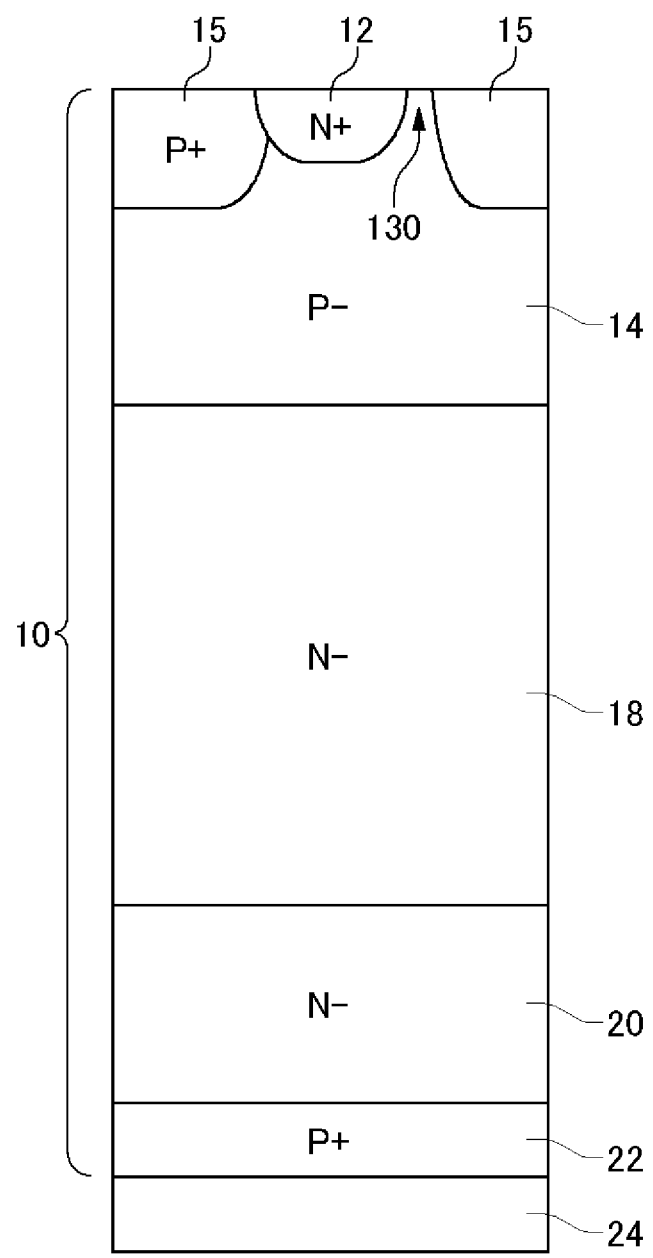
FIG. 9 is a cross-sectional view showing the emitter region 12 and the contact region 15 formed using the masks shown in FIG. 8.

FIG. 9 is a cross-sectional view showing the emitter region 12 and the contact region 15 formed using the masks shown in FIG. 8. FIG. 9 shows a cross section along the extending direction of the trench portions. The emitter region 12 and the contact region 15 are formed alternately along the extending direction of the trench portions.

However, if the position of the opening of the emitter mask 110 or the contact mask 120 is misaligned, a gap 130 might be formed between the emitter region 12 and the contact region 15. In this case, the emitter region 12 and the contact region 15 are divided by the base region 14 on the front surface of the semiconductor substrate 10. As a result, a distance for which holes pass through the base region 14 having a low concentration is increased, and occurrence of the latch-up is facilitated.

Figure 10A:
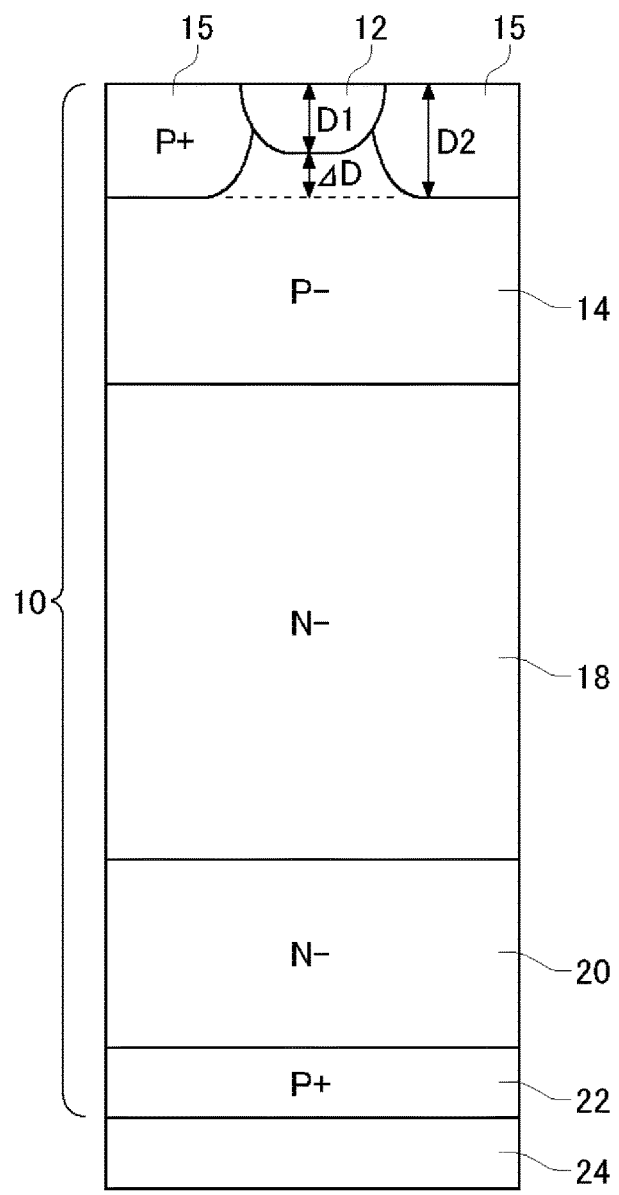
FIG. 10A shows a cross section taken along d-d' shown in FIG. 2.

FIG. 10A shows a cross section taken along d-d' shown in FIG. 2. The cross section taken along d-d' is a plane which passes through the central position between two trench portions and is parallel to the extending direction of the trench portions. In the semiconductor device 100 of the present example, the emitter region 12 and the contact region 15 are formed using the emitter mask 110 and the contact mask 120 shown in FIG. 6. As described above, even if the opening positions of the emitter mask 110 and the contact mask 120 are varied, the opening positions of the emitter mask 110 and the contact mask 120 partially overlap with each other, and it is therefore possible to suppress formation of the gap 130 between the emitter region 12 and the contact region 15. This makes it possible to suppress the latch-up.

The depth D2 of the contact region 15 at its central position is greater than the depth D1 of the emitter region 12. As one example, the difference ΔD between D1 and D2 is 0.2 μm or less. The length L1 of the emitter region 12 at the central position between two trench portions may be greater than ΔD.

By forming the length L1 of the emitter region 12 to be a predetermined length or more, it is possible to prevent diffusion of P-type impurities in a portion that needs to be of N-type in a region adjacent to trench portions and to reserve the length L2 of the emitter region 12. Also, the interval between parts of the opening of the contact mask 120 shown in FIG. 6, that is, the interval between implantation regions into which P-type impurities are implanted may be greater than ΔD.

Two parts of the contact region 15 provided sandwiching the emitter region 12 on the front surface of the semiconductor substrate 10 are also separated inside the semiconductor substrate 10. That is, the contact region 15 is not formed below the emitter region 12. Such a structure makes it possible to suppress diffusion of P-type impurities from the contact region 15 into regions at which the emitter region 12 contacts trench portions and to reserve a region in which a channel is to be formed.

That is, by reserving the length L1 of the emitter region 12 that is greater than ΔD, it can be ensured that, even if P-type impurities implanted into the contact region 15 are diffused, the P-type impurities do not reach the center portion in the trench longitudinal direction of a region at which the emitter region 12 contacts the gate trench portion 40.

Figure 10B:
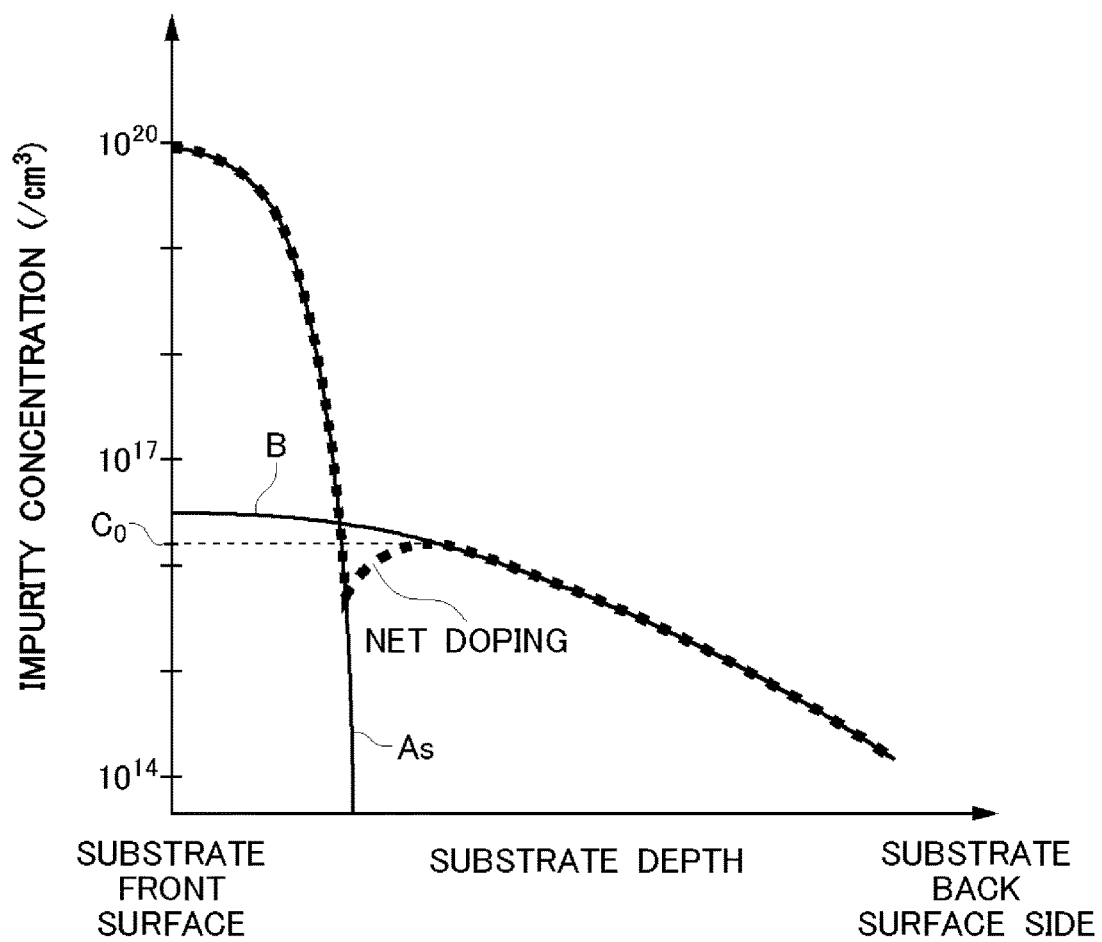
FIG. 10B shows a concentration distribution of a trench sidewall near the center of f-f' in FIG. 2.

FIG. 10B shows a concentration distribution near a trench sidewall at the center of f-f' in FIG. 2. The center of f-f' is the center in the trench longitudinal direction of a region at which the emitter region 12 contacts the gate trench portion 40. The gate threshold is dependent on the peak concentration $C_0$ in the base region in the net doping concentration near the trench sidewall. As one example, the peak concentration $C_0$ is in the order of $1\times10^{16}/cm^3$.

If P-type impurities from the contact region 15, the amount of which is in the order of $1\times10^{19}/cm^3$, for example, reach this region to any extent, the peak concentration $C_0$ increases, and therefore the gate threshold increases. In contrast, by reserving the length L1 of the emitter region 12 that is greater than ΔD as in the present example embodiment, it can be ensured that P-type impurities are prevented from reaching a region of f-f' that has the same length as the mesa region at its center in the emitter region near the trench sidewall, and it is therefore possible to stabilize the threshold. This effect cannot be easily arrived at with the conventionally known configuration.

Figure 11:
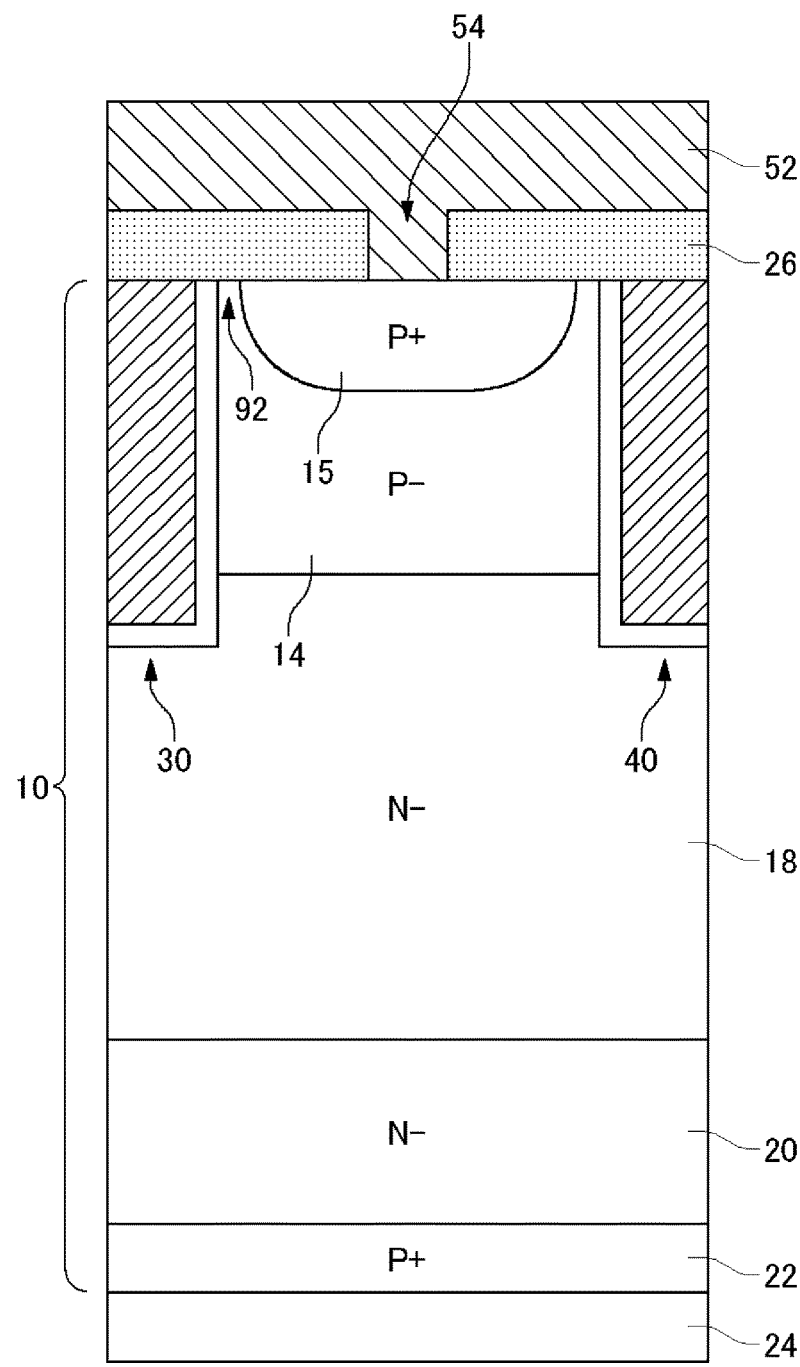
FIG. 11 shows one example of a cross section taken along e-e' in FIG. 2.

FIG. 11 shows one example of a cross section taken along e-e' in FIG. 2. The cross section taken along e-e' is a plane which is perpendicular to the extending direction of the trench portions and passes through a position closer to the contact region 15 in the vicinity of the contact point 94 shown in FIG. 2.

As shown in FIG. 11, on the front surface of the semiconductor substrate 10, the contact region 15 is formed apart from the contact point 94 (see FIG. 2) at which the sidewall of the trench portion and the boundary 90 of the emitter region 12 contact each other. In the cross section taken along e-e', a gap 92 is formed between the contact region 15 and the trench portion. In the vicinity of the contact point 94, the base region 14 is exposed on the front surface of the semiconductor substrate 10.

On the other hand, as shown in FIG. 5, the contact region 15 is formed to positions contacting trench portions at the central portion of the contact region 15 in the extending direction of the trench portions. End portions of the contact region 15 contacting trench portions contact the base region exposed on the front surface of the semiconductor substrate 10 at the gap 92. That is, in regions contacting trench portions, the base region 14 is exposed on the front surface of the semiconductor substrate 10 between end portions of the contact region 15 and end portions of the emitter region 12.

Such a configuration makes it possible to prevent P-type impurities from diffusing to the vicinity of the contact point 94 to shorten the length L2 of the emitter region 12 contacting the trench portion. For example, it is possible to make the length L2 of the emitter region 12 almost the same as the length of the opening of the emitter mask 110.

Note that the area of the contact region 15 refers to a region having a higher impurity concentration than the maximum value of the impurity concentration of the base region 14. As the maximum value of the impurity concentration of the base region 14, the maximum value of the impurity concentration of a part of the base region 14 in which the contact region 15 and the emitter region 12 are not formed may be used. For example, the maximum value of the P-type impurity concentration distribution of a region in which the base region 14 is exposed on the front surface of the semiconductor substrate as shown in FIG. 1 and which extends to the drift region 18 in the depth direction may be used as the maximum value of the impurity concentration of the base region 14. The maximum value of the P-type impurity concentration in a part of the base region 14 formed below the emitter region 12 may also be used.

Also, as one example, the maximum value of the impurity concentration of the contact region 15 is 10 times or more greater or 100 times or more greater than the maximum value of the impurity concentration of the base region 14. Therefore, if impurities from the contact region 15 reach the vicinity of the contact point 94, the length L2 of the emitter region 12 is significantly influenced. According to the present example, the contact region 15 is not formed to the contact point 94, and it is therefore possible to reserve the length L2 of the emitter region 12.

Note that, in another example, the contact region 15 may also be formed to the sidewalls of trench portions in the cross section taken along e-e'. In this case, it is preferable that a region of the contact region 15 contacting the sidewalls of trench portions is formed to be shallower than a region of the emitter region 12 contacting the sidewalls of the trench portions.

Figure 12:
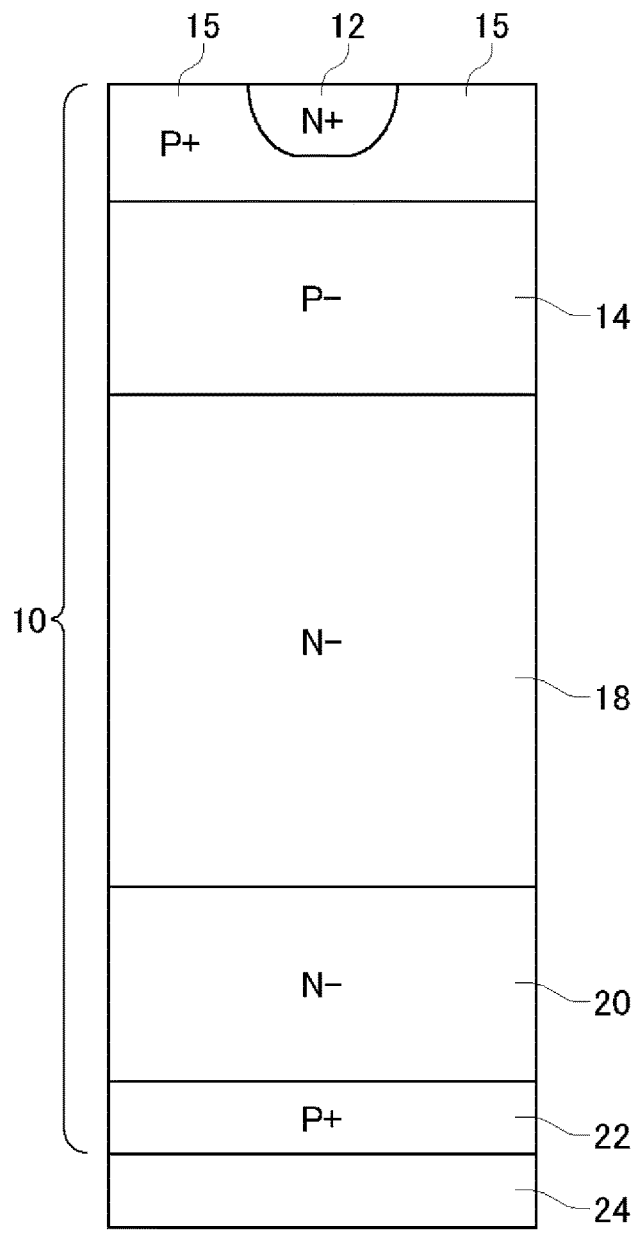
FIG. 12 shows another example of the cross section taken along d-d' shown in FIG. 2.

FIG. 12 shows another example of the cross section taken along d-d' shown in FIG. 2. In the present example, two parts of the contact region 15 provided sandwiching the emitter region 12 on the front surface of the semiconductor substrate 10 are connected below the emitter region 12. According to the semiconductor device 100 of the present example, the contact region 15 having a high concentration is formed below the emitter region 12, and therefore the resistance at a region through which holes pass when turning off can be lowered to suppress the latch-up.

Figure 13:
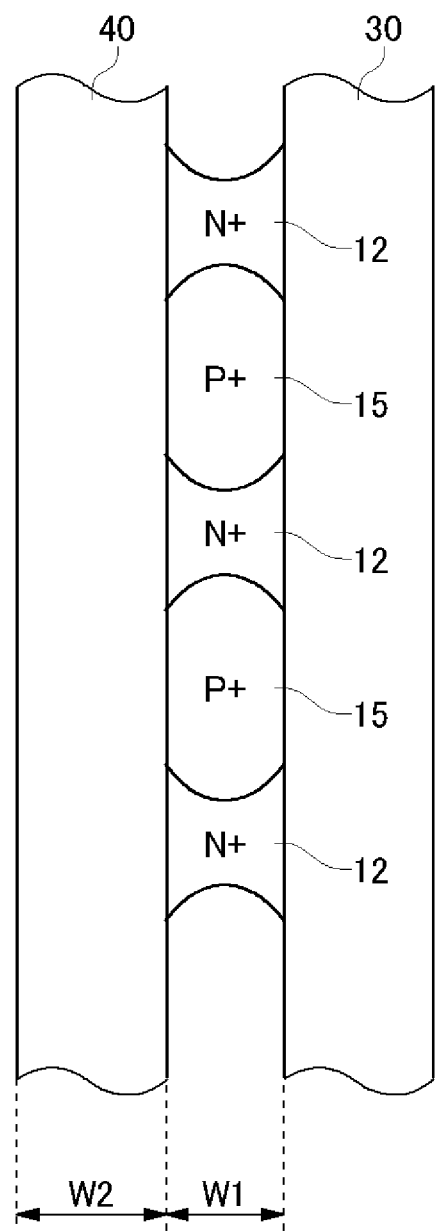
FIG. 13 shows one example of a region sandwiched between trench portions.

FIG. 13 shows one example of a region sandwiched between trench portions. In the present example, the width of each of the gate trench portion 40 and the dummy trench portion 30 is referred to as W2. Also, the distance between two trench portions is referred to as W1. W2 may be greater than W1.

There is a limit to miniaturization of the trench portion because the insulating film and the conductive portion are formed in the trench. Therefore, if the semiconductor device 100 is miniaturized, the width W2 of a trench portion might be greater than the distance W1 between trench portions.

For example, the width W2 of a trench portion is greater than 1 μm and the distance W1 between trench portions is 1 μm or less. On the other hand, if the shape of the boundary of the emitter region 12 is formed in a step-wise shape, the shape of the mask opening used needs to be according to the step-wise shape. However, it is difficult to implant impurities using a mask opening having a shape such as a step-wise shape in a fine range such as 1 μm or less. In contrast, according to the manufacturing method shown in FIG. 6, the shape of the boundary of the emitter region 12 is adjusted by diffusing P-type impurities implanted between two trench portions. Therefore, even if the width W2 of the trench portion is greater than the distance W1 between trench portions, the opening shape of the mask is not complex and can be easily miniaturized.

Figure 14:
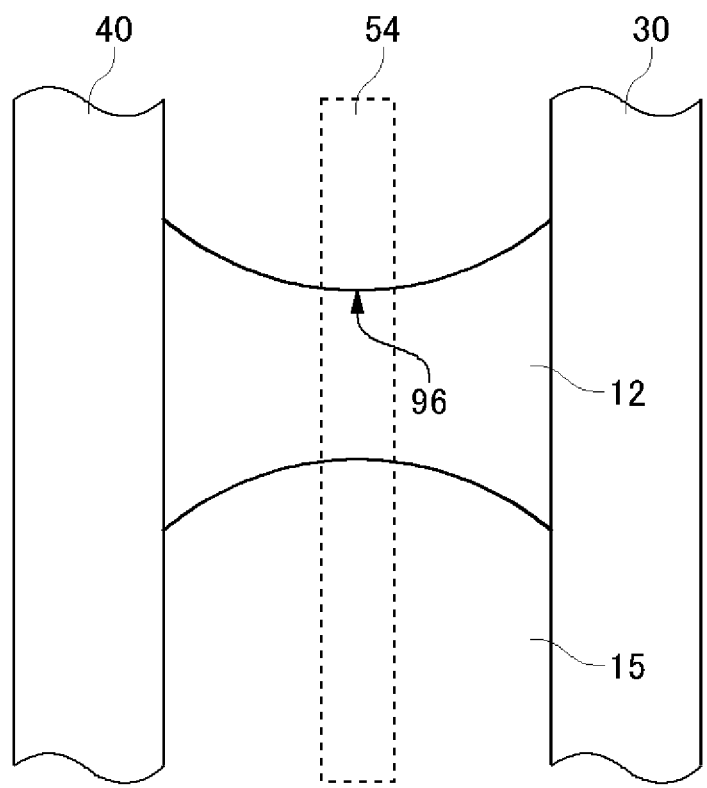
FIG. 14 shows one example of the emitter region 12 and the contact hole 54.

FIG. 14 shows one example of the emitter region 12 and the contact hole 54. The contact hole 54 is formed in a region facing the contact region 15 and a region facing the emitter region 12 in the interlayer insulating film 26 formed on the front surface of the semiconductor substrate 10. The contact hole 54 may be formed continuously across a region facing the emitter region 12 and a region facing the contact region 15.

The contact hole 54 is formed in a region facing the central position between two trench portions. That is, the contact hole 54 is formed in a portion of the emitter region 12 having the shortest length in the extending direction of the trench portions. Also, the contact hole 54 is not formed in regions contacting trench portions. That is, the contact hole 54 is not formed in portions of the emitter region 12 having the greatest length in the extending direction of the trench portions.

Also, the emitter region 12 includes a region 96 having a substantially constant length. For example, the region 96 refers to a region of the emitter region 12 having a length of 1.1×L1 or less. L1 refers to the shortest length of the emitter region 12. Such a configuration makes it possible, even if the position of the contact hole 54 is misaligned, to reduce variation in the area of the emitter region 12 connected to the emitter electrode 52.

Figure 15:
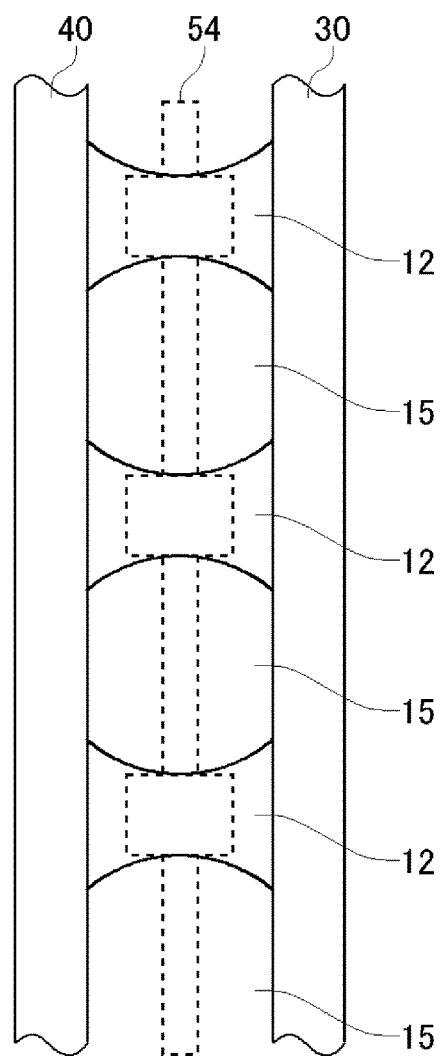
FIG. 15 shows another example of the shape of the contact hole 54.

FIG. 15 shows another example of the shape of the contact hole 54. In the present example, the width of at least a part of a portion of the contact hole 54 formed facing the emitter region 12 is greater than the width of a portion of the contact hole 54 formed facing the contact region 15. For example, the width of a portion of the contact hole 54 facing the emitter region 12 is two or more times greater than the width of a portion of the contact hole 54 formed facing the contact region 15.

Such a configuration makes it possible to increase the area of the emitter region 12 connected to the emitter electrode 52. As described above, if the semiconductor device 100 is miniaturized, the area occupied by mesa portions on the front surface of the semiconductor substrate 10 decreases with respect to the area occupied by trench portions. In this case, the area in which the semiconductor substrate 10 and the emitter electrode 52 contact each other decreases, and the heat release efficiency is lowered. As a result, occurrence of the latch-up is facilitated. In contrast, according to the semiconductor device 100 of the present example, the area of the semiconductor substrate 10 contacting the emitter electrode 52 can be increased, and it is therefore possible to improve the heat release efficiency and suppress latch-up.

Figure 16:
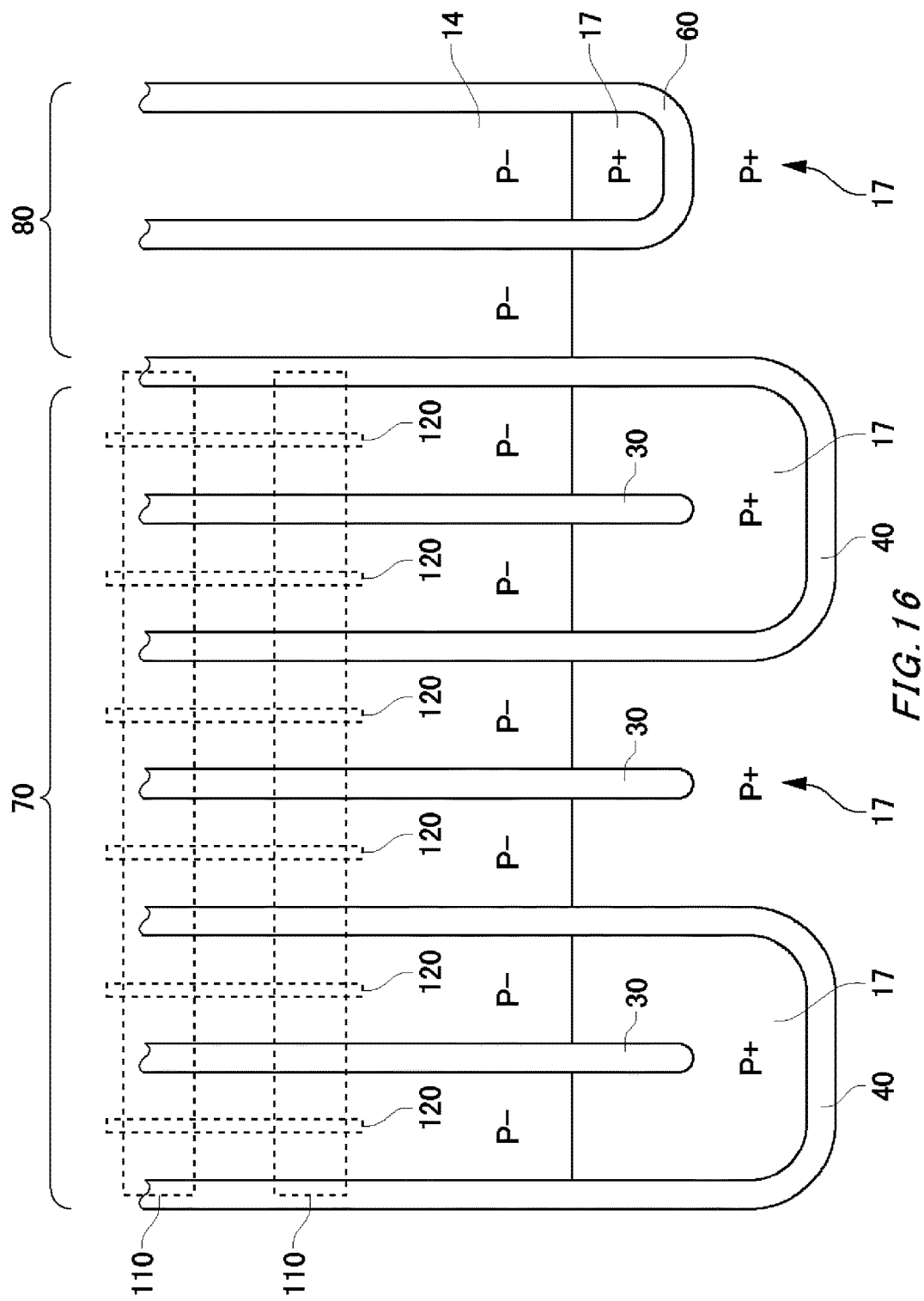
FIG. 16 shows another example of the opening shape of the contact mask 120.

FIG. 16 shows another example of the opening shape of the contact mask 120. Although the opening of the contact mask 120 is provided being separated corresponding to regions in which the contact region 15 is to be formed in the example shown in FIG. 6, the opening of the contact mask 120 in the present example is provided continuously across a plurality of regions in which the contact region 15 is to be formed.

According to the present example, it is also possible to form the emitter region 12 having a shape illustrated with reference to FIG. 1 to FIG. 15. It is also possible to easily form the contact region 15 in the form which increases the effect of suppressing the latch-up as shown in FIG. 12.

Figure 17:
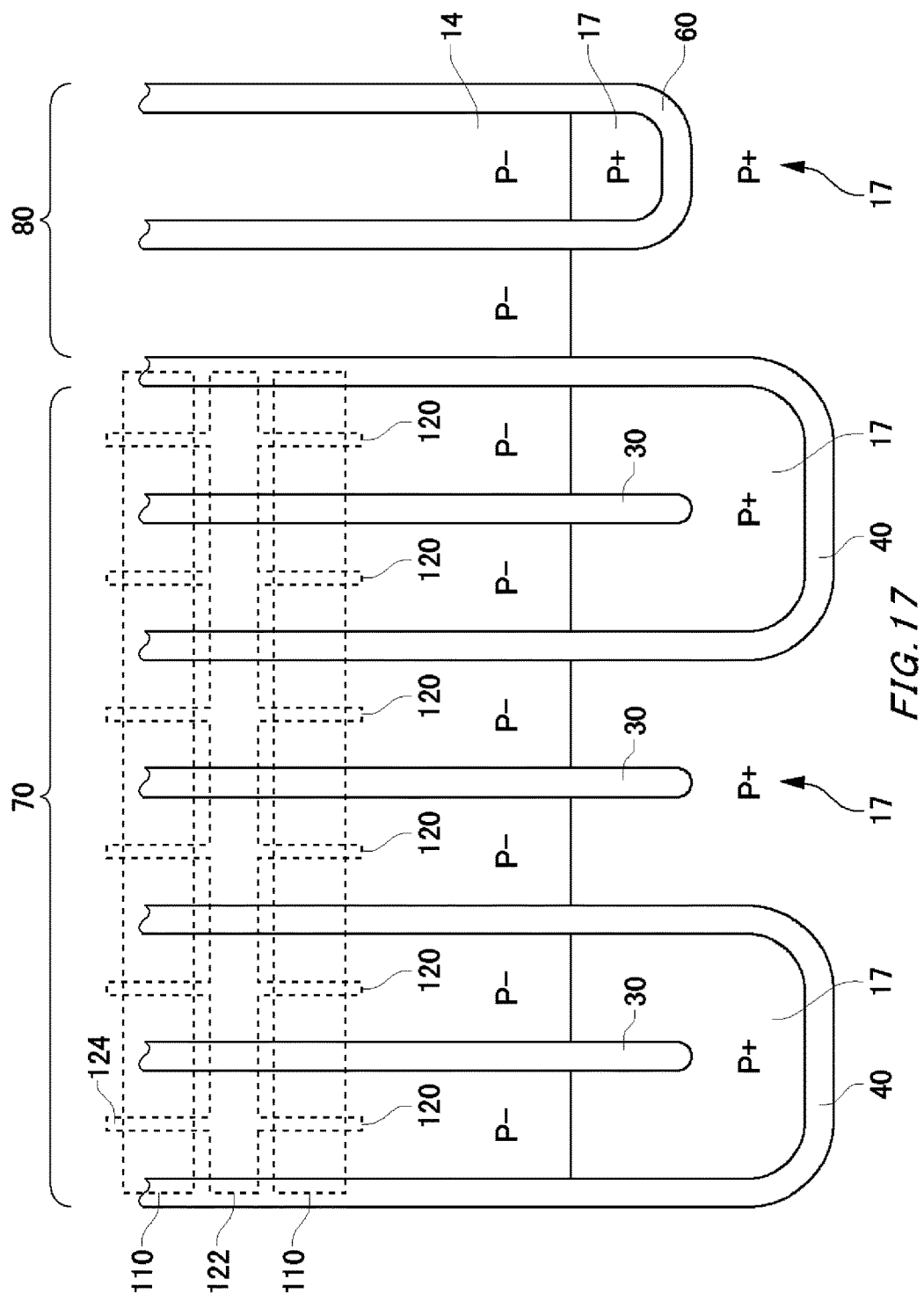
FIG. 17 shows another example of the opening shape of the contact mask 120.

FIG. 17 shows another example of the opening shape of the contact mask 120. In the present example, the opening of the contact mask 120 has a first region 122 and a second region 124. The shape of the second region 124 is the same as the shape of the opening of the contact mask 120 shown in FIG. 16.

The first region 122 is formed facing a region in which the contact region 15 is to be formed and across adjacent two trench portions. In the present example, the first region 122 is formed continuously across a plurality of trench portions. Such a shape of the contact mask 120 makes it possible to easily form the contact region 15 contacting two trench portions at the central portion of the contact region 15. Also, since the second region 124 is continuously formed, it is possible to easily form the contact region 15 in the form which increases the effect of suppressing the latch-up as shown in FIG. 12.

Figure 18:
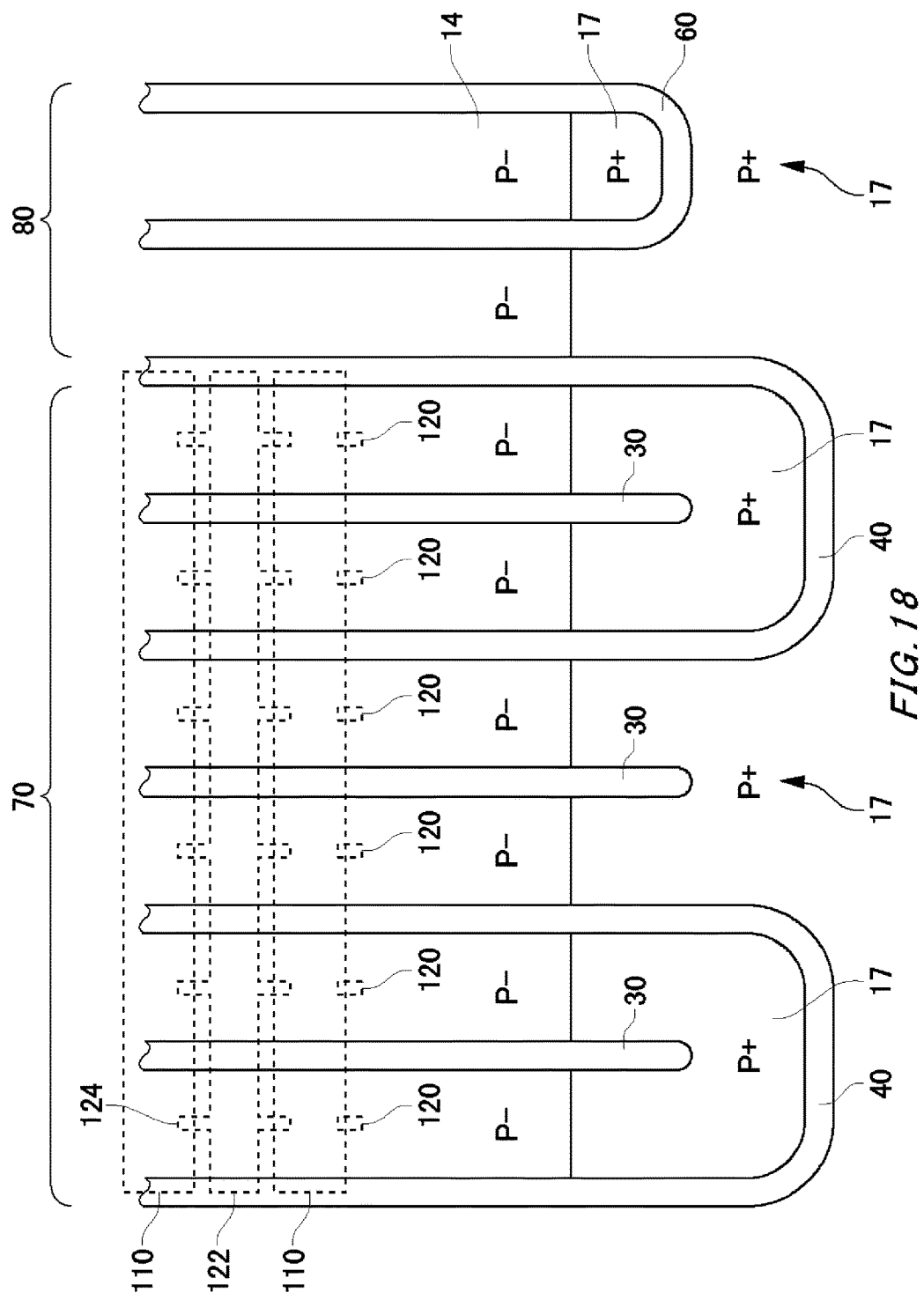
FIG. 18 shows another example of the opening shape of the contact mask 120.

FIG. 18 shows another example of the opening shape of the contact mask 120. In the present example, the opening of the contact mask 120 has a first region 122 and a second region 124. The shape of the second region 124 is the same as the shape of the opening of the contact mask 120 shown in FIG. 6. Also, the shape of the first region 122 is the same as the shape of the first region 122 shown in FIG. 17.

According to the present example, it is possible to easily form the contact region 15 contacting two trench portions at the central portion of the contact region 15. Also, since the second region 124 is formed being separated corresponding to parts of the contact region 15, it is possible to easily form the contact region 15 in the form shown in FIG. 10A.

Figure 19:
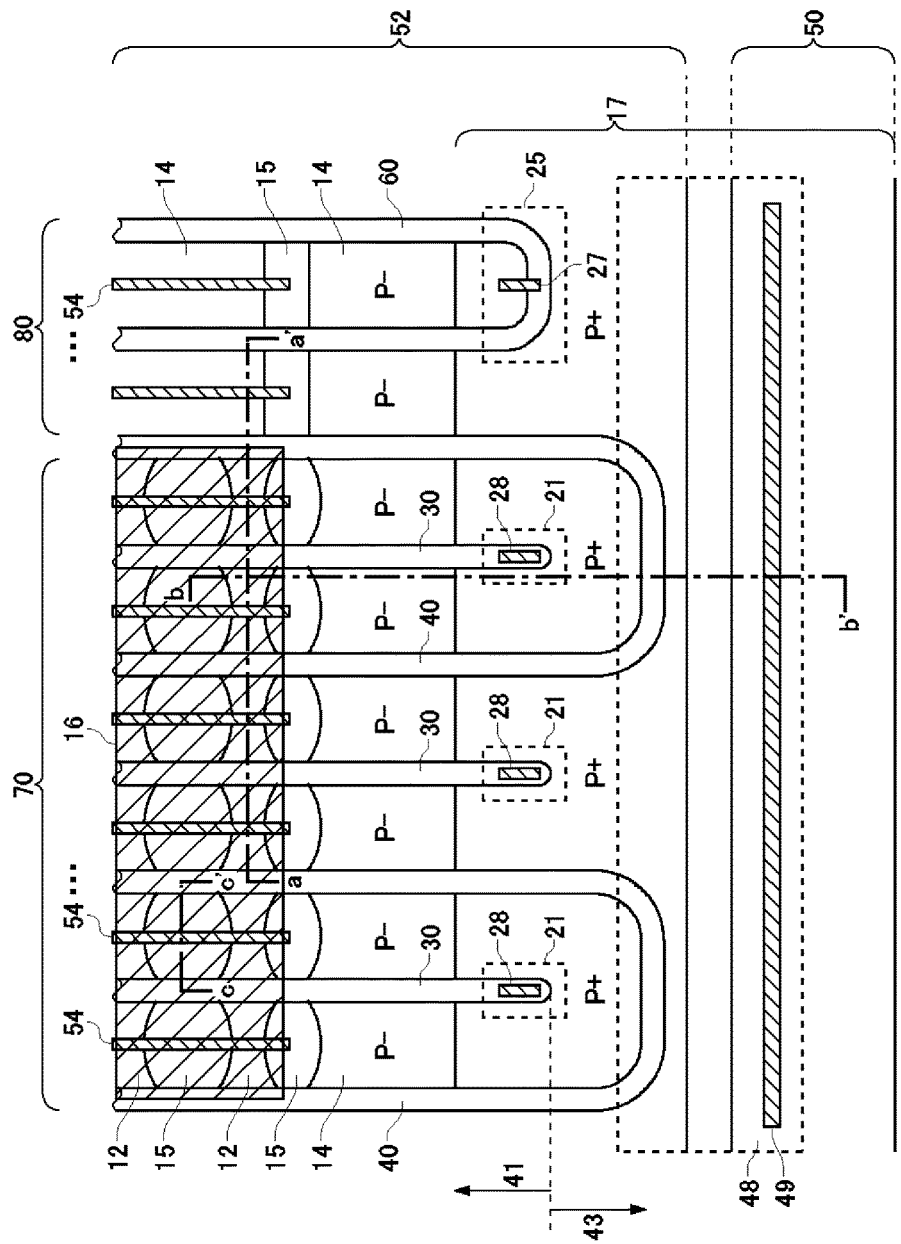
FIG. 19 is a plan view showing another example of the semiconductor device 100.
Figure 20:
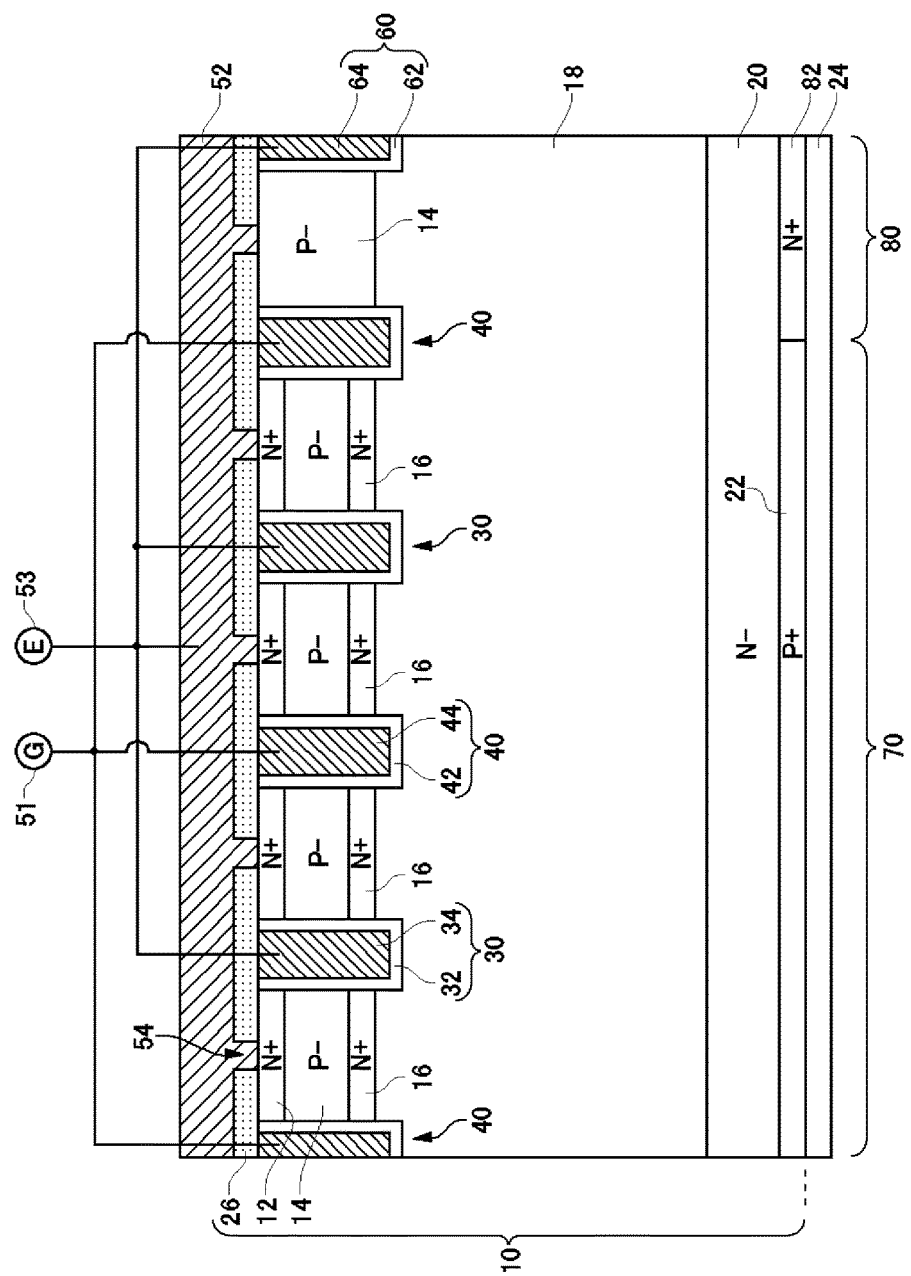
FIG. 20 shows one example of the cross section taken along a-a' in FIG. 19.
Figure 21:
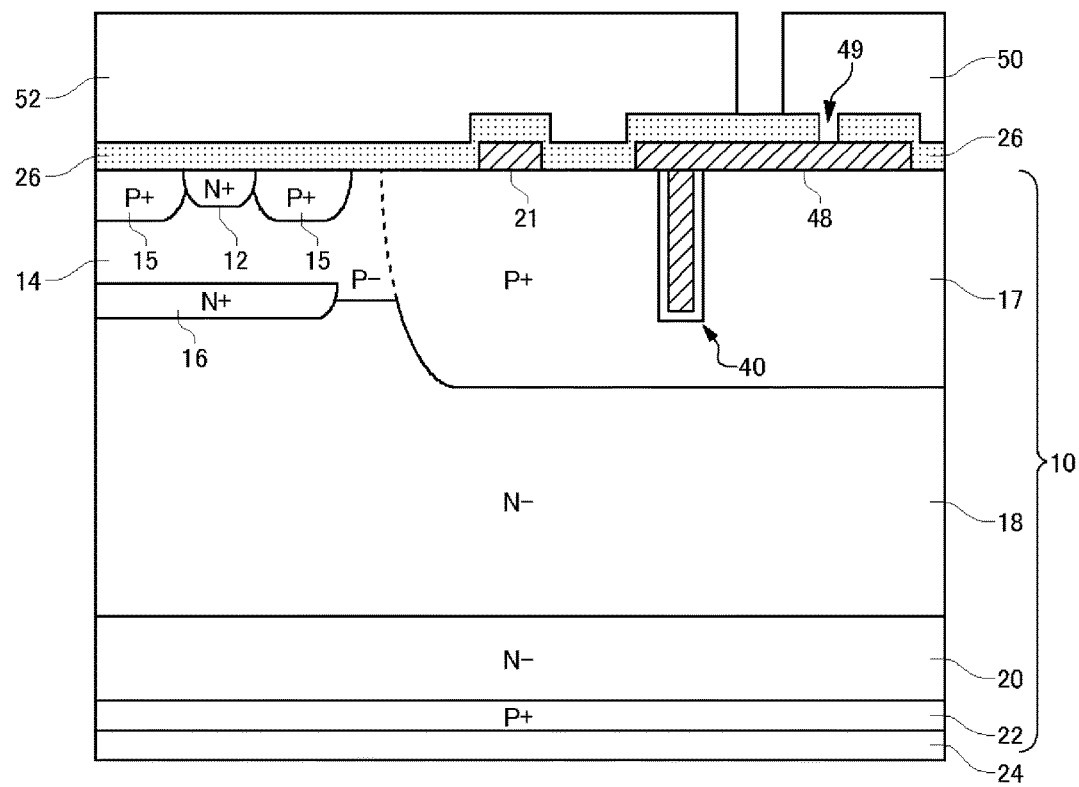
FIG. 21 shows a cross section taken along b-b' in FIG. 19.
Figure 22:
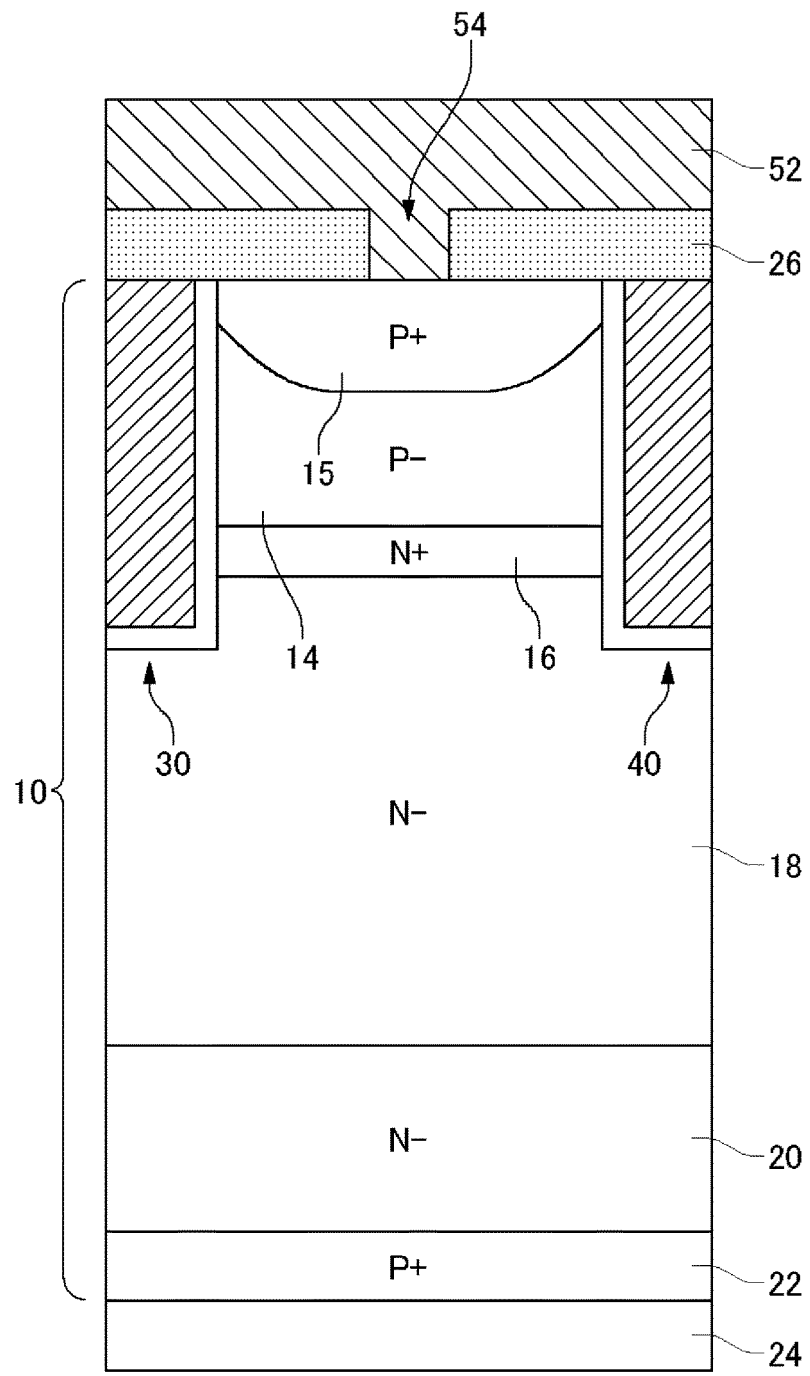
FIG. 22 shows a cross section taken along c-c' in FIG. 19.

FIG. 19 is a plan view showing another example of the semiconductor device 100. FIG. 20 shows one example of the cross section taken along a-a' in FIG. 19. FIG. 21 shows a cross section taken along b-b' in FIG. 19. FIG. 22 shows a cross section taken along c-c' in FIG. 19.

In the present example, the semiconductor device 100 further includes an accumulation region 16 in addition to the configuration of the semiconductor device 100 in each form illustrated with reference to FIG. 1 to FIG. 18. The accumulation region 16 is an (N+)-type region having a higher impurity concentration than the drift region 18. The configuration including the accumulation region 16 can be applied to the semiconductor device 100 in each form shown in FIG. 7, FIG. 16, FIG. 17 and FIG. 18.

As shown in FIG. 20 to FIG. 22, the accumulation region 16 in the present example is formed between the base region 14 and the drift region 18 in the transistor section 70. By providing the accumulation region 16, accumulation of holes is facilitated, and the degree of conductivity modulation can be increased.

In FIG. 19, an area in which the accumulation region 16 is formed is indicated as a region hatched by oblique lines. However, the accumulation region 16 may not be formed in a region overlapping the dummy trench portion 30 or the gate trench portion 40. In the present example, the accumulation region 16 is formed in a portion of the base region 14 in the transistor section 70 above which the emitter region 12 or the contact region 15 are formed. Note that, as shown in FIG. 19 and FIG. 20, the accumulation region 16 may also be formed in a part of the region below the contact region 15 closest to the well region 17.

Note that, in the semiconductor device 100 in each form illustrated in FIG. 1 to FIG. 22, P-type impurities such as $BF_2$ may be implanted into the upper surface of the contact region 15 in the transistor section 70. The impurities are implanted via the contact hole 54. It is preferable to perform a heat treatment after implanting impurities. The condition of the heat treatment is, for example, at 850° C. and for approximately 10 seconds. Such a treatment allows a plug implantation region having a higher concentration to be formed in a region contacting the emitter electrode 52 at the emitter region 12 and the contact region 15 in the transistor section 70 to improve the latch-up resistance in the transistor section 70. Also, even if the semiconductor device 100 is miniaturized, it is easy to maintain the latch-up resistance.

Also, P-type impurities such as $BF_2$ may be implanted into the upper surface of the base region 14 in the diode section 80. The impurities are implanted via the contact hole 54. It is preferable to perform a heat treatment after implanting impurities. The condition of the heat treatment is, for example, at 850° C. and for approximately 10 seconds. Such a treatment allows a plug implantation region having a higher concentration to be formed in a region contacting the emitter electrode 52 at the base region 14 in the diode section 80 to lower the contact resistance between the semiconductor substrate 10 and the emitter electrode 52 in the diode section 80. The emitter electrode 52 may include a barrier metal at a portion contacting the semiconductor substrate 10. The barrier metal contains, for example, titanium or the like.

The impurity implantation and the heat treatment for the transistor section 70 and the diode section 80 may be performed in the same process. The process may be performed after the formation of the contact region 15 and the heat treatment process.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
a semiconductor substrate;
a plurality of trench portions which are provided at a front surface side of the semiconductor substrate and each of which has a portion extending in an extending direction; and
a first conductivity-type emitter region and a second conductivity-type contact region which are provided between adjacent two trench portions and exposed on a front surface of the semiconductor substrate alternately in the extending direction, wherein
on the front surface of the semiconductor substrate, a length of the emitter region at a central position between the two trench portions is shorter than a length of the emitter region at portions contacting the trench portions, and
on the front surface of the semiconductor substrate, at least a part of a boundary of the emitter region has a curved shape.

2. The semiconductor device according to claim 1, wherein the length of the emitter region at the central position is greater than a difference between a depth of the emitter region and a depth of the contact region at the central position.

3. The semiconductor device according to claim 1, wherein the length of the emitter region at the central position is greater than ⅓ of a length of the emitter region at portions contacting the trench portions.

4. The semiconductor device according to claim 1, wherein the length of the emitter region at the central position is greater than half a distance between the two trench portions.

5. The semiconductor device according to claim 1, wherein a depth of at least a partial region of the contact region formed gradually decreases as a distance from each of the trench portions decreases.

6. The semiconductor device according to claim 5, wherein on the front surface of the semiconductor substrate, the contact region is formed apart from a point at which a sidewall of each of the trench portions and the boundary of the emitter region contact each other.

7. The semiconductor device according to claim 6, wherein on the front surface of the semiconductor substrate, a central portion of the contact region in the extending direction is formed contacting a sidewall of each of the trench portions.

8. The semiconductor device according to claim 6, comprising a second conductivity-type base region which is sandwiched between the trench portions, is shallower than a depth of each of the trench portions at positions contacting the trench portions, is deeper than a depth of the contact region, and has a lower impurity concentration than the contact region, wherein
the base region is exposed on the front surface of the semiconductor substrate,
an end of each portion of the contact region contacting the trench portions contacts the base region exposed on the front surface of the semiconductor substrate.

9. The semiconductor device according to claim 8, further comprising:
a drift region which is provided below the base region and has a lower impurity concentration than the emitter region; and
an accumulation region which is provided between the drift region and the base region and has a higher impurity concentration than the drift region.

10. The semiconductor device according to claim 9, further comprising:
an emitter electrode formed above the semiconductor substrate; and
an interlayer insulating film formed between the semiconductor substrate and the emitter electrode, wherein
in the interlayer insulating film, a contact hole for connecting the emitter electrode to the contact region is formed, and
in a region of the contact region contacting the emitter electrode, a plug implantation region having a higher concentration than other portions of the contact region is formed.

11. The semiconductor device according to claim 1, wherein two parts of the contact region provided sandwiching one part of the emitter region on the front surface of the semiconductor substrate are also separated inside the semiconductor substrate.

12. The semiconductor device according to claim 1, wherein two parts of the contact region provided sandwiching one part of the emitter region on the front surface of the semiconductor substrate are connected below the emitter region.

13. The semiconductor device according to claim 1, wherein a width of each of the trench portions is greater than a distance between the two trench portions.

14. The semiconductor device according to claim 1, further comprising an interlayer insulating film which is formed on the front surface of the semiconductor substrate, and in which a contact hole is formed in a region facing the contact region and a region facing the emitter region, wherein the contact hole is formed in a region facing the central position and is not formed in regions contacting the trench portions.

15. The semiconductor device according to claim 14, wherein the contact hole is formed facing a region of the emitter region having a substantially constant length.

16. The semiconductor device according to claim 14, wherein a width of at least a partial region of a part of the contact hole formed facing the emitter region is greater than a width of a part of the contact hole formed facing the contact region.

17. The semiconductor device according to claim 1, comprising a plurality of emitter regions arrayed in the extending direction, wherein
on the front surface of the semiconductor substrate, the contact region or a base region is exposed at a sidewall of each of the trench portions, and the plurality of emitter regions are spaced apart from each other.

18. A manufacturing method for manufacturing a semiconductor device comprising a semiconductor substrate, a plurality of trench portions which are provided at a front surface side of the semiconductor substrate and each of which has a portion extending in an extending direction, and a first conductivity-type emitter region and a second conductivity-type contact region which are provided between adjacent two trench portions and exposed on a front surface of the semiconductor substrate alternately in the extending direction, wherein:
the emitter region is formed by implanting first conductivity-type impurities into the front surface of the semiconductor substrate using an emitter mask having an opening width that is greater than an interval between the two trench portions;
the contact region is formed by implanting second conductivity-type impurities into the front surface of the semiconductor substrate using a contact mask having an opening width that is smaller than the interval between the two trench portions; and
a region into which the second conductivity-type impurities are implanted partially overlaps with a region into which the first conductivity-type impurities are implanted.

19. The manufacturing method according to claim 18, wherein an opening of the contact mask is separated corresponding to each part of the contact region, and an interval between parts of the opening is greater than a difference between a depth of the emitter region and a depth of the contact region at a central position between the two trench portions.

20. The manufacturing method according to claim 18, wherein a length of the emitter region at a central position between the two trench portions is greater than a distance between each of the trench portions and an opening of the contact mask.

21. The manufacturing method according to claim 18, wherein both ends of each opening of the contact mask overlap with an opening of the emitter mask.

\* \* \* \* \*